United States Patent
Uchino et al.

(10) Patent No.: US 10,411,182 B2
(45) Date of Patent: Sep. 10, 2019

(54) DRIVE APPARATUS

(71) Applicant: SUMITOMO PRECISION PRODUCTS CO., LTD., Hyogo (JP)

(72) Inventors: Ryohei Uchino, Hyogo (JP); Osamu Torayashiki, Hyogo (JP); Akio Mugishima, Hyogo (JP)

(73) Assignee: SUMITOMO PRECISION PRODUCTS CO., LTD., Hyogo (JP)

( * ) Notice: Subject to any disclaimer, the term of this patent is extended or adjusted under 35 U.S.C. 154(b) by 290 days.

(21) Appl. No.: 15/265,288

(22) Filed: Sep. 14, 2016

(65) Prior Publication Data

US 2017/0005257 A1    Jan. 5, 2017

Related U.S. Application Data

(63) Continuation of application No. PCT/JP2015/001651, filed on Mar. 24, 2015.

(30) Foreign Application Priority Data

Mar. 28, 2014 (JP) ................................. 2014-068601

(51) Int. Cl.
*H01L 41/09* (2006.01)
*B81B 3/00* (2006.01)
(Continued)

(52) U.S. Cl.
CPC ............ *H01L 41/09* (2013.01); *B81B 3/0045* (2013.01); *G02B 26/0858* (2013.01);
(Continued)

(58) Field of Classification Search
CPC . H01L 41/053; H01L 41/094; G02B 26/0841; G02B 26/0858
See application file for complete search history.

(56) References Cited

U.S. PATENT DOCUMENTS

2007/0158552 A1* 7/2007 Kim .................... G02B 26/0841
250/306
2010/0171744 A1* 7/2010 Kawano ............. G02B 26/0841
345/440.1

FOREIGN PATENT DOCUMENTS

JP       09-159939 A    6/1997
JP       2008-242245 A  10/2008
(Continued)

OTHER PUBLICATIONS

International Search Report for corresponding International Application No. PCT/JP2015/001651 dated Jun. 2, 2015.
(Continued)

*Primary Examiner* — Derek J Rosenau
(74) *Attorney, Agent, or Firm* — Renner, Otto, Boisselle & Sklar, LLP

(57) ABSTRACT

A mirror device 200 disclosed herein includes a base 202, a mirror 205, an actuator 206, a fixed comb electrode 208, and a movable comb electrode 207. The movable comb electrode 207 includes: a beam portion 271; a hinge 273 configured to couple the beam portion 271 to the actuator 206 and having lower rigidity than the beam portion 271; a hinge 274 configured to couple the beam portion 271 to the base 202 and having lower rigidity than the beam portion 271; and electrode fingers 272, 272, . . . provided for the beam portion 271 and facing electrode fingers 281, 281, . . . of the fixed comb electrode 208. The movable comb electrode 207 is configured to tilt around a tilt axis B5 that passes through the hinge 274.

12 Claims, 11 Drawing Sheets

(51) Int. Cl.
G02B 26/08 (2006.01)
H01L 41/047 (2006.01)
H01L 41/083 (2006.01)

(52) U.S. Cl.
CPC .......... *H01L 41/047* (2013.01); *H01L 41/083* (2013.01); *B81B 2201/042* (2013.01); *B81B 2203/058* (2013.01)

(56) References Cited

FOREIGN PATENT DOCUMENTS

JP          2013-160953 A     8/2013
WO    WO 2014/156060 A1    10/2014

OTHER PUBLICATIONS

Form PCT/ISA/237 for corresponding International Application No. PCT/JP2015/001651 dated Jun. 2, 2015.

* cited by examiner

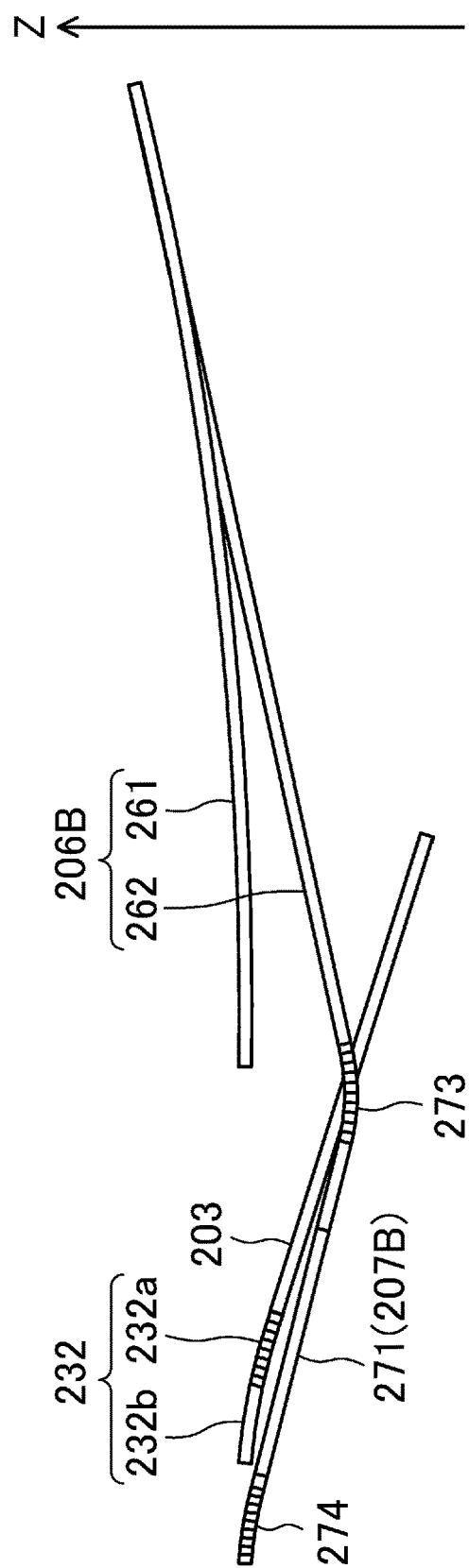

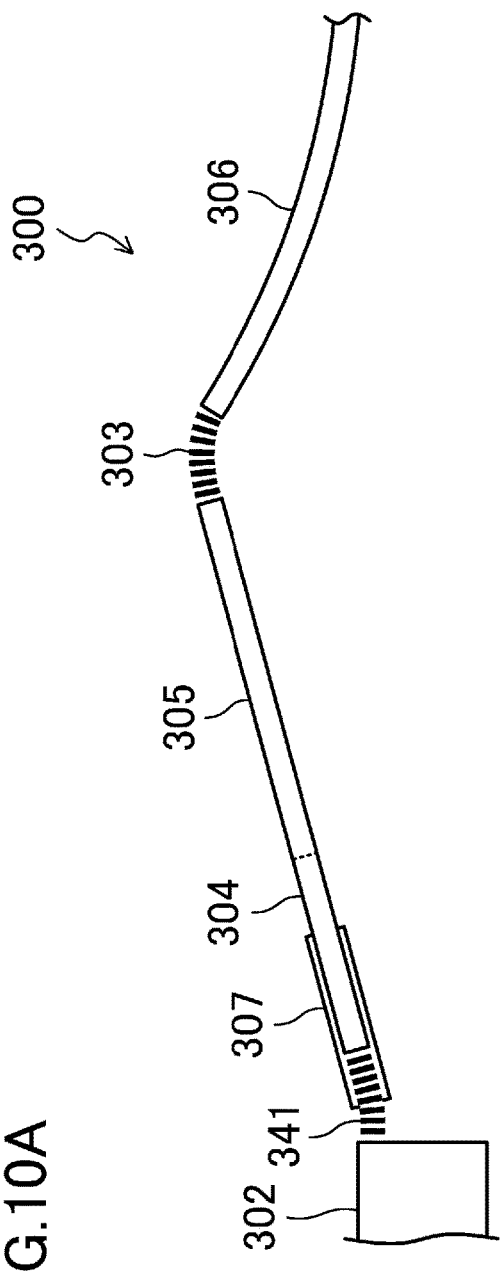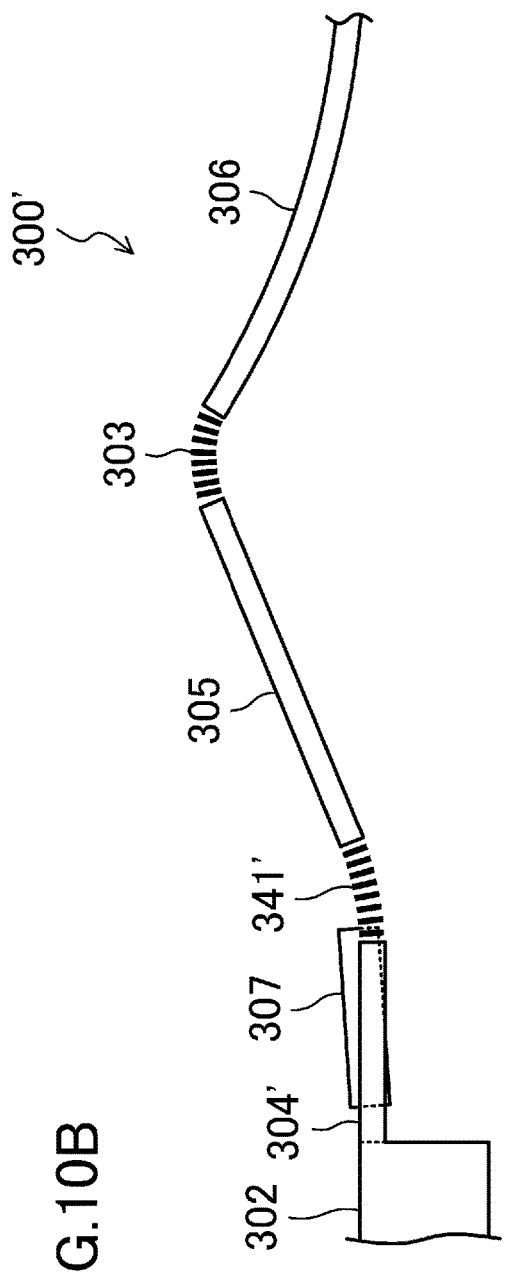

DRIVE APPARATUS

TECHNICAL FIELD

The present disclosure relates to a drive apparatus.

BACKGROUND ART

Various types of drive apparatuses have heretofore been known in the art. For example, in the mirror device disclosed in Patent Document 1, a mirror, functioning as a moving part, is tilted around a predetermined axis by an actuator, and the displacement of the mirror during the tilt is detected by comb electrodes. The comb electrodes include a movable comb electrode coupled to the mirror and a fixed comb electrode provided for a frame and facing the movable comb electrode. The displacement of the mirror is detected based on a variation in capacitance between these movable and fixed comb electrodes. Specifically, the electrode fingers of the movable comb electrode and those of the fixed comb electrode are alternately arranged in a predetermined arrangement direction so as to be close to each other but keep out of contact with each other. When the mirror is displaced, the electrode fingers of the movable comb electrode are displaced perpendicularly to the arrangement direction to cause a variation in the capacitance between the movable and fixed comb electrodes. The displacement of the mirror is detected based on this variation in capacitance.

CITATION LIST

Patent Document

PATENT DOCUMENT 1: Japanese Unexamined Patent Publication No. 2013-160953

SUMMARY OF INVENTION

Technical Problem

However, if the electrode fingers of the movable comb electrode are displaced in an unexpected direction other than the direction perpendicular to the arrangement direction, then it is difficult to obtain the magnitude of displacement of the mirror based on such a variation in capacitance. For example, if the electrode fingers of the movable comb electrode are displaced in the arrangement direction, then the gap between the electrode fingers changes, thus causing a variation in capacitance as well. That is why even if the capacitance has varied, it is difficult to determine whether or not the variation has resulted from the displacement of the mirror in the expected direction. Furthermore, if the movable and fixed comb electrodes contact with each other, then the capacitance cannot be detected any longer in the first place.

In view of the foregoing background, it is therefore an object of the present disclosure to obtain the magnitude of displacement of a moving part accurately based on the capacitance between the movable and fixed comb electrodes.

Solution to the Problem

The present disclosure provides a drive apparatus including: a base; a moving part; an actuator coupled to the moving part and configured to cause the moving part to tilt by tilting itself; a fixed comb electrode provided for the base and having electrode fingers; and a movable comb electrode arranged to face the fixed comb electrode. The movable comb electrode includes: a beam portion; an input-side connector configured to couple the beam portion to either the moving part or the actuator, having lower rigidity than the beam portion, and being elastically deformable; a support-side connector configured to couple the beam portion to the base, having lower rigidity than the beam portion, and being elastically deformable; and electrode fingers provided for the beam portion and facing the electrode fingers of the fixed comb electrode. The movable comb electrode is configured to tilt around a tilt axis that passes through the support-side connector.

According to this configuration, a tilt of the actuator causes the moving part to tilt. The beam portion of the movable comb electrode is coupled to either the actuator or the moving part via the input-side connector. Thus, as either the actuator or the moving part tilts, the beam portion is displaced accordingly. The beam portion is coupled to the base via the support-side connector, and therefore, tilts around a tilt axis that passes through the support-side connector. Then, portions of the movable and fixed comb electrodes that face each other change their area to cause a variation in capacitance between the movable and fixed comb electrodes. Based on this variation in capacitance, the magnitude of displacement of a portion of the beam portion provided with the input-side connector may be obtained. The input-side connector is coupled to either the actuator or the moving part. Thus, once the magnitude of displacement of that portion of the beam portion provided with the input-side connector is known, the magnitude of displacement of either the actuator or the moving part may be obtained. The actuator is coupled to the moving part. Thus, once the magnitude of displacement of the actuator is known, the magnitude of displacement of the moving part may also be obtained. In this manner, the magnitude of displacement of the moving part may be obtained based on a variation in capacitance.

In such a configuration, the beam portion of the movable comb electrode is coupled to either the actuator or the moving part via the input-side connector that is elastically deformable. As the actuator or moving part is displaced, the input-side connector is deformed accordingly. Thus, part of the displacement of the actuator or the moving part is absorbed into the input-side connector and the rest is conducted to the beam portion. For that reason, a slight displacement of the actuator or moving part is absorbed into the input-side connector, and the conduction of the displacement to the beam portion is reduced. On the other hand, a dominant displacement of the actuator or moving part is conducted to the beam portion mainly. That is to say, the beam portion may be displaced mainly in a direction corresponding to the dominant displacement of the actuator or moving part, while the magnitude of displacement of the beam portion in the direction corresponding to the slight displacement of the actuator or moving part may be reduced. As a result, the movable comb electrode may be tilted with the gap between the respective electrode fingers of the movable and fixed comb electrodes maintained.

Advantages of the Invention

This drive apparatus may obtain the magnitude of displacement of the moving part accurately based on the capacitance between the movable and fixed comb electrodes.

BRIEF DESCRIPTION OF THE DRAWINGS

FIG. 3 is a side view as viewed in an X-axis direction, illustrating how a mirror, a second actuator, and a second movable comb electrode are displaced when the second actuator is activated.

FIGS. 4A and 4B illustrate how the mirror device operates when viewed in the X-axis direction, wherein FIG. 4A illustrates a state of the mirror device before the mirror tilts, and FIG. 4B illustrates a state of the mirror device while the mirror is tilting.

FIGS. 5A and 5B illustrate how the mirror device operates when viewed in a Y-axis direction, wherein FIG. 5A illustrates a state of the mirror device before the mirror tilts, and FIG. 5B illustrates a state of the mirror device while the mirror is tilting.

FIGS. 10A and 10B illustrate generally how the movable comb electrode is displaced as the mirror tilts, wherein FIG. 10A illustrates a mirror device and FIG. 10B illustrates a partial variation of the mirror device for the purpose of comparison.

DESCRIPTION OF EMBODIMENTS

Exemplary embodiments will now be described in detail with reference to the accompanying drawings.

First Embodiment

Figure 1:
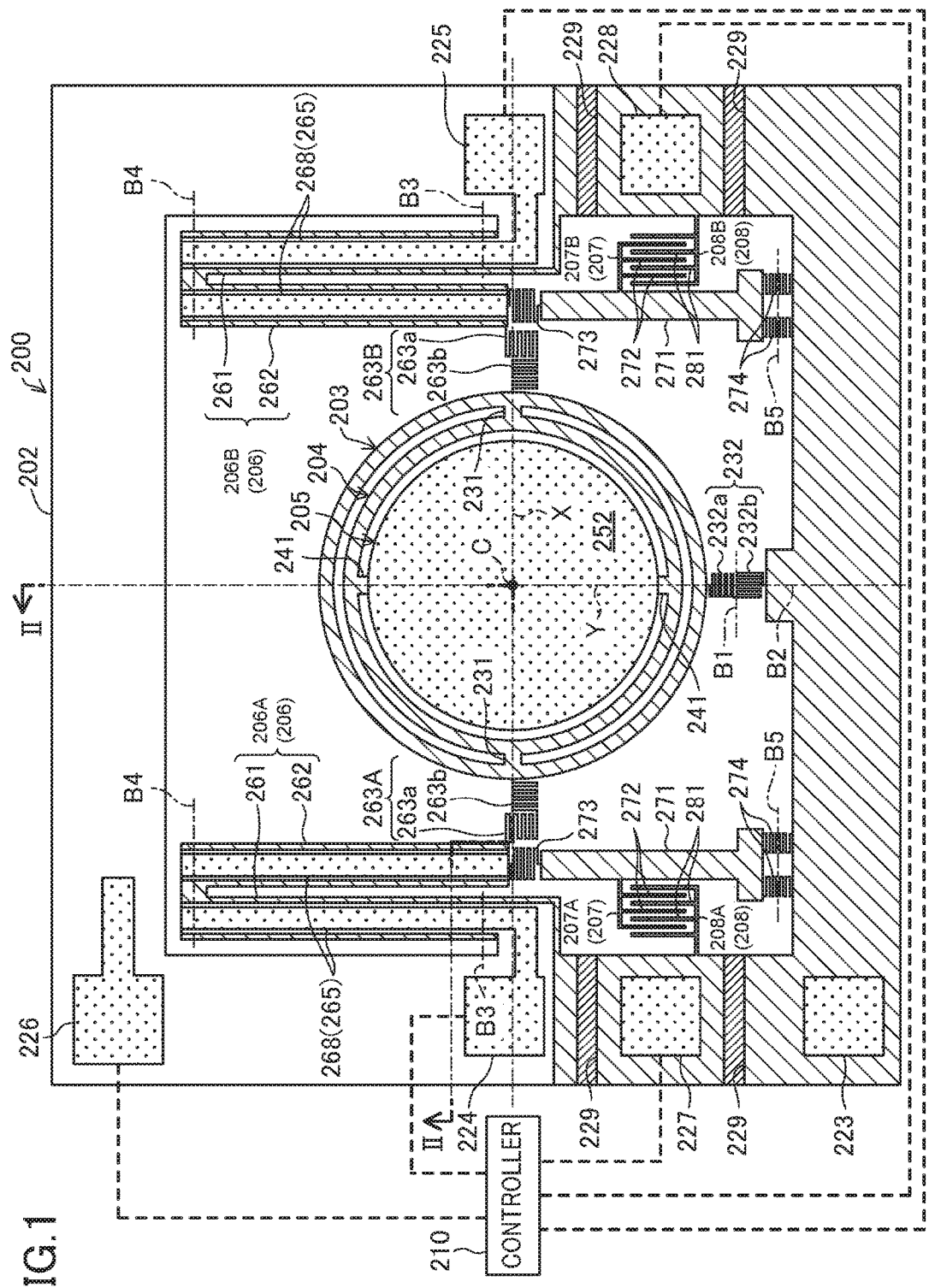
FIG. 1 is a plan view of a mirror device according to a first embodiment.
Figure 2:
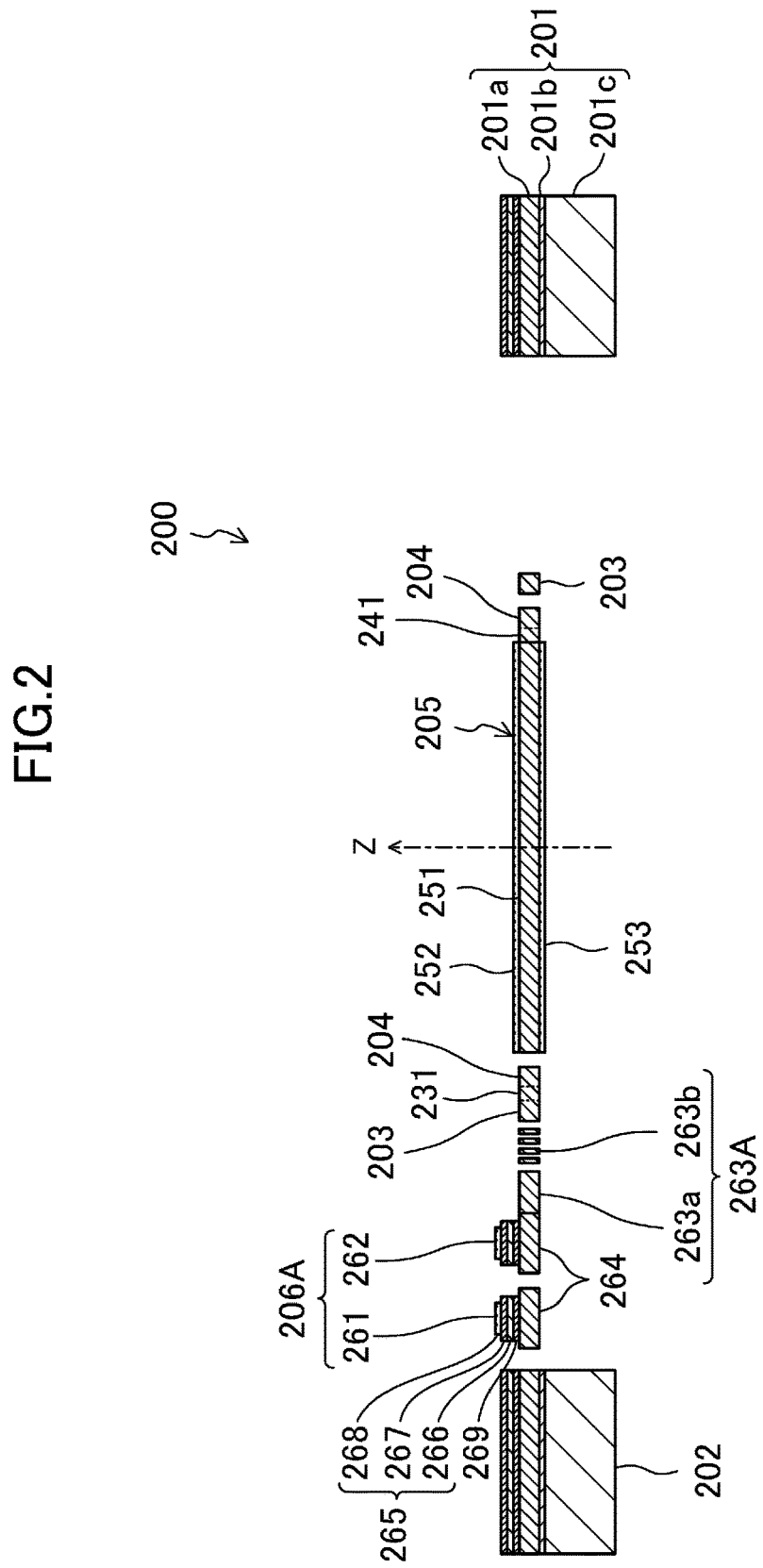
FIG. 2 is a cross-sectional view of the mirror device taken along the plane II-II shown in FIG. 1.

FIG. 1 is a plan view of a mirror device 200. FIG. 2 is a cross-sectional view of the mirror device 200 taken along the plane II-II shown in FIG. 1.

This mirror device 200 is fabricated on a silicon on insulator (SOI) substrate 201 (see FIG. 2). The SOI substrate 201 includes a first silicon layer 201a of single crystalline silicon, an oxide layer 201b of SiO$_2$, and a second silicon layer 201c of single crystalline silicon which are stacked one upon the other in this order.

The mirror device 200 includes: a base 202; a first tilting part 203 coupled to the base 202; a second tilting part 204 coupled to the first tilting part 203; a mirror 205 coupled to the second tilting part 204; two actuators 206, 206 coupled to the first tilting part 203 to cause the mirror 205 to tilt via the first and second tilting parts 203, 204; two movable comb electrodes 207, 207 provided for the two actuators 206, 206, respectively; two fixed comb electrodes 208, 208 provided for the base 202; and a controller 210. The mirror device 200 is an exemplary drive apparatus.

Note that if these two actuators 206, 206 need to be distinguished from each other, these actuators will be hereinafter referred to as a "first actuator 206A" and a "second actuator 206B," respectively. Likewise, if the two movable comb electrodes 207, 207 need to be distinguished from each other, the movable comb electrode 207 associated with the first actuator 206A will be hereinafter referred to as a "first movable comb electrode 207A," and the movable comb electrode 207 associated with the second actuator 206B will be hereinafter referred to as a "second movable comb electrode 207B." In the same way, if the two fixed comb electrodes 208, 208 need to be distinguished from each other, the fixed comb electrode 208 associated with the first actuator 206A will be hereinafter referred to as a "first fixed comb electrode 208A," and the fixed comb electrode 208 associated with the second actuator 206B will be hereinafter referred to as a "second fixed comb electrode 208B."

The base 202 is formed to have a substantially rectangular frame shape. The base 202 is comprised of the first silicon layer 201a, the oxide layer 201b, and the second silicon layer 201c.

The mirror 205 is formed to have a disk shape. The mirror 205 includes a mirror body 251 and a mirror-finished layer 252 stacked on the surface of the mirror body 251. The mirror body 251 is formed out of the first silicon layer 201a, while the mirror-finished layer 252 has a multilayer structure comprised of Au and Ti films. Note that another mirror-finished layer 253 similar to the mirror-finished layer 252 is also stacked on the back surface of the mirror body 251. The mirror-finished layer 253 has the function of canceling film stress caused by the mirror-finished layer 252 on the surface of the mirror body 251. As a result, the degree of planarity of the mirror body 251, and eventually, that of the mirror-finished layer 252, may be increased. The mirror 205 is an exemplary moving part.

In this embodiment, X- and Y-axes are defined to be axes that extend along the surface of the base 202 (i.e., the surface of the SOI substrate 201) and that intersect with each other at right angles at the center C of the mirror 205 in a non-operating state. Also, a Z-axis is defined to be an axis that passes through the center C of the mirror 205 in a non-operating state and that intersects at right angles with both of the X- and Y-axes.

The second tilting part 204 is arranged outside of the mirror 205 and formed in the shape of a ring that surrounds the mirror 205. The second tilting part 204 is coupled to the mirror 205 via a pair of second connectors 241, 241. The second tilting part 204 and the second connectors 241, 241 are formed out of the first silicon layer 201a.

The pair of second connectors 241, 241 are arranged so as to face each other with the center C of the mirror 205 interposed between them. Particularly, the pair of second connectors 241, 241 are arranged on the Y-axis.

The first tilting part 203 is arranged outside of the second tilting part 204 and formed in the shape of a ring that surrounds the second tilting part 204. The first tilting part 203 is coupled to the second tilting part 204 via a pair of first connectors 231, 231. The first tilting part 203 is also coupled to the base 202 via a hinge 232. The first tilting part 203, the first connectors 231, 231, and the hinge 232 are formed out of the first silicon layer 201a.

The pair of first connectors 231, 231 are arranged so as to face each other with the center C of the mirror 205 interposed between them. Particularly, the pair of first connectors 231, 231 are arranged on the X-axis. That is to say, each of the first connectors 231 is arranged to be shifted 90 degrees from an associated one of the second connectors 241 around the center C of the mirror 205.

The hinge 232 is formed to be elastically deformable. Particularly, the hinge 232 includes a plurality of straight portions and a folded portion that couples together respective ends of adjacent ones of the straight portions, and has a winding shape as a whole. The hinge 232 includes a first hinge 232a, of which the straight portions extend in the X-axis direction, and a second hinge 232b, of which the straight portions extend in the Y-axis direction. The first hinge 232a is easily flexed around an axis extending in the X-axis direction. On the other hand, the second hinge 232b is easily flexed around an axis extending in the Y-axis direction. The first hinge 232a is coupled to the first tilting part 203. The second hinge 232b is coupled to the base 202. As used herein, the "*-axis direction" refers to a direction that is parallel to the *-axis.

Each of the actuators 206 includes a first straight portion 261, one end of which is coupled to the base 202 and which extends in the Y-axis direction, and a second straight portion 262, one end of which is coupled to the other end of the first straight portion 261 and which extends in the Y-axis direction so as to be folded with respect to the first straight portion 261. The other end of the second straight portion 262, opposite from the end coupled to the first straight portion 261 (and hereinafter referred to as a "tip end"), is coupled to the first tilting part 203 via a hinge 263.

As shown in FIG. 2, the first and second straight portions 261 and 262 each include an actuator body 264 and a piezoelectric element 265 stacked on the surface of the actuator body 264.

The actuator body 264 is formed to have a rectangular plate shape in a plan view. The actuator body 264 is formed out of the first silicon layer 201a.

The piezoelectric element 265 is provided on the principal surface of the actuator body 264 (i.e., on the same side as the mirror-finished layer 252 of the mirror 205). An SiO₂ layer 269 is stacked on the surface of the actuator body 264, and the piezoelectric element 265 is stacked on the SiO₂ layer 269. Just like the actuator body 264, the piezoelectric element 265 is formed to have a rectangular plate shape in a plan view. The piezoelectric element 265 includes a lower electrode 266, an upper electrode 268, and a piezoelectric layer 267 sandwiched between these two electrodes 266, 268. The lower electrode 266, piezoelectric layer 267, and upper electrode 268 are stacked in this order on the SiO₂ layer 269. The piezoelectric element 265 is made of different materials from the SOI substrate 201. Specifically, the lower electrode 266 has a multilayer structure comprised of Pt and Ti films. The piezoelectric layer 267 is made of lead zirconate titanate (PZT). The upper electrode 268 has a multilayer structure comprised of Au and Ti films.

The base 202 includes: a first upper terminal 224 electrically connected to the upper electrode 268 of the first straight portion 261 of the first actuator 206A; a second upper terminal 225 electrically connected to the upper electrode 268 of the first straight portion 261 of the second actuator 206B; and a lower terminal 226 electrically connected to both of the respective lower electrodes 266 of the first straight portions 261 of the first and second actuators 206A and 206B. A voltage is applied to the piezoelectric element 265 of the first straight portion 261 of the first actuator 206A via the first upper terminal 224 and the lower terminal 226. A voltage is applied to the piezoelectric element 265 of the first straight portion 261 of the second actuator 206B via the second upper terminal 225 and the lower terminal 226. Upon the application of a voltage to the piezoelectric element 265 of each actuator 206, the surface of the actuator body 264 on which the piezoelectric element 265 is stacked shrinks, thus causing the tip end of the actuator body 264 to be displaced in the Z-axis direction.

Note that the respective upper electrodes 268 of the first and second straight portions 261 and 262 are electrically insulated from each other. Likewise, the respective lower electrodes 266 of the first and second straight portions 261 and 262 are also electrically insulated from each other.

Each of the hinges 263 is formed to be elastically deformable. Particularly, each hinge 263 includes a plurality of straight portions and a folded portion that couples together respective ends of adjacent ones of the straight portions, and has a winding shape as a whole. The hinge 263 includes a first hinge 263a, of which the straight portions extend in the X-axis direction, and a second hinge 263b, of which the straight portions extend in the Y-axis direction. The first hinge 263a is easily flexed around an axis extending in the X-axis direction. On the other hand, the second hinge 263b is easily flexed around an axis extending in the Y-axis direction. The first hinge 263a is coupled to an associated one of the actuators 206. The second hinge 263b is coupled to the first tilting part 203. Note that if these two hinges 263, 263 need to be distinguished from each other, the hinges 263 respectively coupled to the first and second actuators 206A and 206B will be hereinafter referred to as a "hinge 263A" and a "hinge 263B," respectively.

Each of the movable comb electrodes 207 includes a beam portion 271 extending in the Y-axis direction and three electrode fingers 272, 272, . . . provided for the beam portion 271. One end of the beam portion 271 is coupled to an associated one of the actuators 206 via an associated hinge 273. The other end of the beam portion 271 is bent in an L shape and coupled to the base 202 via two hinges 274, 274. The three electrode fingers 272, 272, . . . extend parallel to each other in the Y-axis direction and are formed in the shape of comb teeth. Note that the number of the electrode fingers 272 does not have to be three.

The hinges 273, 274 are formed to be elastically deformable. Particularly, the hinge 273, 274 each include a plurality of straight portions and a folded portion that couples together respective ends of adjacent ones of the straight portions, and have a winding shape as a whole. The hinges 273, 274 each have straight portions extending in the X-axis direction, and are easily flexed around an axis extending in the X-axis direction. The two hinges 274, 274 are arranged side by side in the X-axis direction. The beam portion 271 is supported by the base 202 via the hinges 274, 274, and configured to tilt around an axis that passes through the hinges 274, 274 and that is parallel to the X-axis. Such an axis that passes through the hinges 274, 274 and that is parallel to the X-axis will be hereinafter referred to as a "tilt axis B5." The hinges 273 are exemplary input-side connectors, and the hinges 274 are exemplary support-side connectors.

The beam portions 271, the electrode fingers 272, 272, . . . , and the hinges 273, 274 are formed out of the first silicon layer 201a.

The fixed comb electrodes 208 are provided along the inner peripheral edge of the base 202. Each of the fixed comb electrodes 208 has four electrode fingers 281, 281, . . . , which extend parallel to each other in the Y-axis direction and are formed in the shape of comb teeth. The three electrode fingers 272, 272, . . . of an associated one of the movable comb electrodes 207 enter the gaps between the four electrode fingers 281, 281, . . . . In this manner, the electrode fingers 272, 272, . . . of each movable comb electrode 207 and the electrode fingers 281, 281, . . . of an associated fixed comb electrode 208 are alternately arranged in the X-axis direction and face each other while keeping out of contact with each other. Note that the number of the electrode fingers 281 does not have to be four.

The base 202 includes a first detection terminal 227, a second detection terminal 228, and a common detection terminal 223. The capacitance between the first movable comb electrode 207A and the first fixed comb electrode 208A is detected with the first detection terminal 227 and the common detection terminal 223. The capacitance between the second movable comb electrode 207B and the second fixed comb electrode 208B is detected with the second detection terminal 228 and the common detection terminal 223.

The first detection terminal 227 is provided on the surface of a portion of the first silicon layer 201a of the base 202 such that the portion is electrically conductive with the first fixed comb electrode 208A. The second detection terminal 228 is provided on the surface of a portion of the first silicon layer 201a of the base 202 such that the portion is electrically conductive with the second fixed comb electrode 208B. The common detection terminal 223 is provided on the surface of a portion of the first silicon layer 201a of the base 202 such that the portion is electrically conductive with the first and second movable comb electrodes 207A and 207B. Those portions of the first silicon layer 201a which are provided with the first and second detection terminals 227, 228 and the common detection terminal 223 are insulated from the rest of the first silicon layer 201a via insulating grooves 229, 229, . . . , which reach the second silicon layer 201c.

—How this Mirror Device Operates—

Next, it will be described how the mirror device 202 with such a configuration operates.

The controller 210 controls the tilt of the mirror 205 by applying a drive voltage to a desired mirror device 200. If the controller 210 applies the drive voltage to the first upper terminal 224 and the lower terminal 226, the first actuator 206A tilts with the drive voltage. If the controller 210 applies the drive voltage to the second upper terminal 225 and the lower terminal 226, the second actuator 206B tilts with the drive voltage. The controller 210 outputs the drive voltages to the first and second actuators 206A and 206B independently of each other. That is to say, the controller 210 controls the magnitudes of tilt of the first and second actuators 206A and 206B independently of each other.

The first and second actuators 206A and 206B each tilt the mirror 205 on the same principle. Thus, it will be described with reference to FIG. 3 only how the second actuator 206B tilts the mirror 205. FIG. 3 is a side view as viewed in the X-axis direction, illustrating how the mirror 205, the second actuator 206B, and the second movable comb electrode 207B are displaced when the second actuator 206B is activated.

As shown in FIG. 3, when a drive voltage is applied to the second actuator 206B, the first straight portion 261 tilts (more specifically, is flexed), and has its tip end displaced in the Z-axis direction (i.e., upward in the example shown in FIG. 3). The second straight portion 262 folded from the tip end of the first straight portion 261 extends in a tangential direction with respect to the tip end of the first straight portion 261. As a result, the tip end of the second straight portion 262 is displaced to the opposite side of the Z-axis direction from the tip end of the first straight portion 261. As can be seen, each of the actuators 206 tilts basically around an axis B3 that passes through the base end of the first straight portion 261 and that is parallel to the X-axis and around an axis B4 that passes through the tip end of the first straight portion 261 and that is parallel to the X-axis. However, since the magnitude of this tilt is slight, the displacement of the tip end of the second straight portion 262 may be regarded as a displacement in the Z-axis direction.

The first tilting part 203 is coupled to the tip end of the second straight portion 262 via the hinge 263B (see FIG. 1). The first tilting part 203 is supported by the base 202 via the hinge 232. Thus, as the tip end of the second straight portion 262 is displaced in the Z-axis direction, the first tilting part 203 tilts on the hinge 232 as a supporting point.

Particularly, the first tilting part 203 tilts not only around a principal axis B1 that passes through the hinge 232 and that is parallel to the X-axis but also around a second axis B2 that passes through the hinge 232 and the center C of the mirror 205 as well. While the mirror 205 is not operating, the second axis B2 agrees with the Y-axis.

For example, if the magnitude of tilt of the first actuator 206A is the same as that of the second actuator 206B, then the magnitude of displacement in the Z-axis direction of a portion of the first tilting part 203 coupled to the hinge 263A is the same as that of another portion of the first tilting part 203 coupled to the hinge 263B. As a result, the first tilting part 203 tilts around the principal axis B1.

On the other hand, if the magnitude of tilt of the first actuator 206A is different from that of the second actuator 206B, then the magnitude of displacement in the Z-axis direction of a portion of the first tilting part 203 coupled to the hinge 263A is different from that of another portion of the first tilting part 203 coupled to the hinge 263B. As a result, the first tilting part 203 tilts around the second axis B2.

In this manner, as the first tilting part 203 tilts, the second tilting part 204 and the mirror 205 also tilt accordingly. The controller 210 adjusts the respective magnitudes of tilt of the first and second actuators 206A and 206B, thereby tilting the mirror 205 in an arbitrary direction by combining the respective tilts of the mirror 205 around the principal and second axes B1 and B2.

Furthermore, an associated one of the movable comb electrodes 207 is coupled to the tip end of each second straight portion 262 via an associated hinge 273. The movable comb electrodes 207 are supported by the base 202 via associated hinges 274, 274. Thus, as the tip end of the second straight portion 262 is displaced in the Z-axis direction, the movable comb electrode 207 tilts on the hinges 274, 274 as supporting points. As a result, respective portions of the electrode fingers 272, 272, . . . of each movable comb electrode 207 and the electrode fingers 281, 281, . . . of an associated fixed comb electrode 208 which face each other change their area, thus causing a variation in the capacitance between the movable and fixed comb electrodes 207 and 208. As can be seen, each of the movable comb electrodes 207 tilts as an associated one of the actuators 206 and the mirror 205 tilt to cause a variation in the capacitance between the movable and fixed comb electrodes 207 and 208.

While tilting the mirror 205, the controller 210 detects the magnitude of tilt of the mirror 205 based on the capacitance between the movable and fixed comb electrodes 207 and 208.

Since the first movable comb electrode 207A is coupled to the tip end of the first actuator 206A via the hinge 273, the displacement in the Z-axis direction of the tip end of the first actuator 206A may be detected based on the capacitance between the first movable comb electrode 207A and the first fixed comb electrode 208A. As the first tilting part 203 is coupled to the tip end of the first actuator 206A via the hinge 263A, the displacement in the Z-axis direction of the tip end of the first actuator 206A may be substantially regarded as the displacement in the Z-axis direction of a portion of the first tilting part 203 which is coupled to the hinge 263A.

Likewise, since the second movable comb electrode 207B is coupled to the tip end of the second actuator 206B via the hinge 273, the displacement in the Z-axis direction of the tip end of the second actuator 206B may be detected based on the capacitance between the second movable comb electrode 207B and the second fixed comb electrode 208B. As the first tilting part 203 is coupled to the tip end of the second actuator 206B via the hinge 263B, the displacement in the Z-axis direction of the tip end of the second actuator 206B may be substantially regarded as the displacement in the Z-axis direction of a portion of the first tilting part 203 which is coupled to the hinge 263B.

The controller 210 detects the capacitance between the first movable comb electrode 207A and the first fixed comb electrode 208A via the first detection terminal 227 and the common detection terminal 223. Also, the controller 210 detects the capacitance between the second movable comb electrode 207B and the second fixed comb electrode 208B via the second detection terminal 228 and the common detection terminal 223. The controller 210 regulates the respective voltages applied to the first and second actuators 206A and 206B based on the capacitance between the first movable comb electrode 207A and the first fixed comb electrode 208A and the capacitance between the second movable comb electrode 207B and the second fixed comb electrode 208B, respectively, thereby controlling the magnitude of tilt of the mirror 205.

In this manner, the controller 210 regulates the drive voltage applied to any of the actuators 206 while detecting the magnitude of tilt of the mirror 205 based on the capacitance between the movable and fixed comb electrodes 207 and 208, thereby causing the mirror 205 to tilt in a desired direction.

Figure 4A:
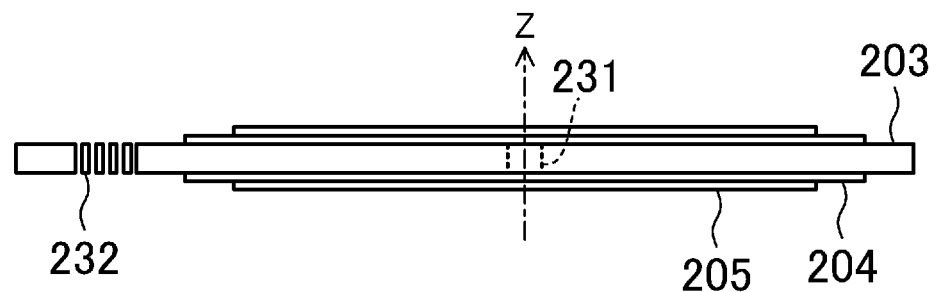
Figure 4B:
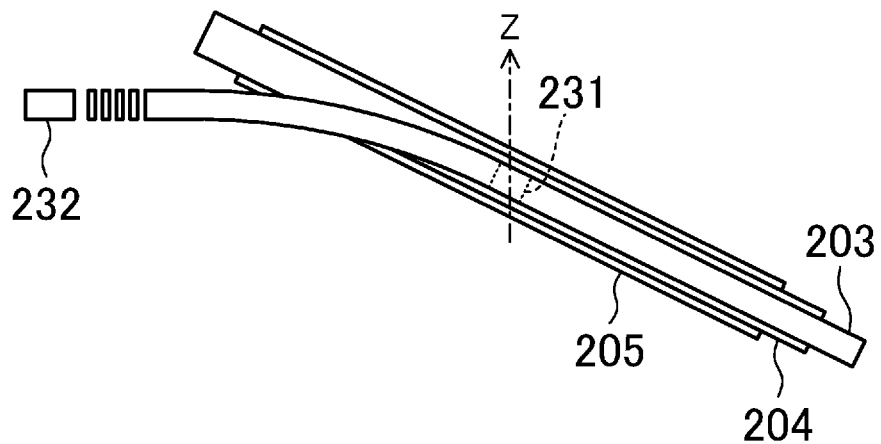
Figure 5A:
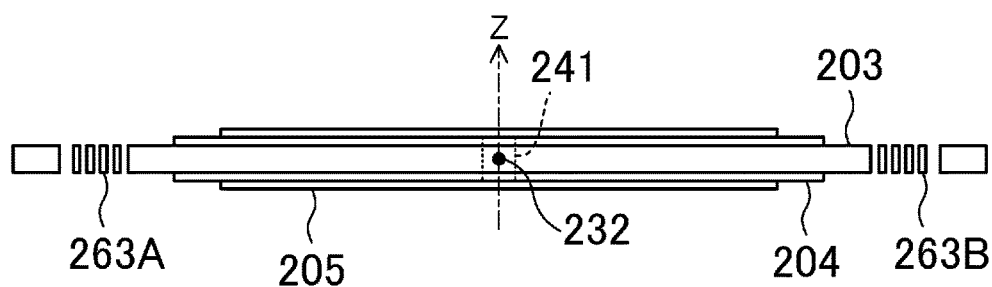
Figure 5B:
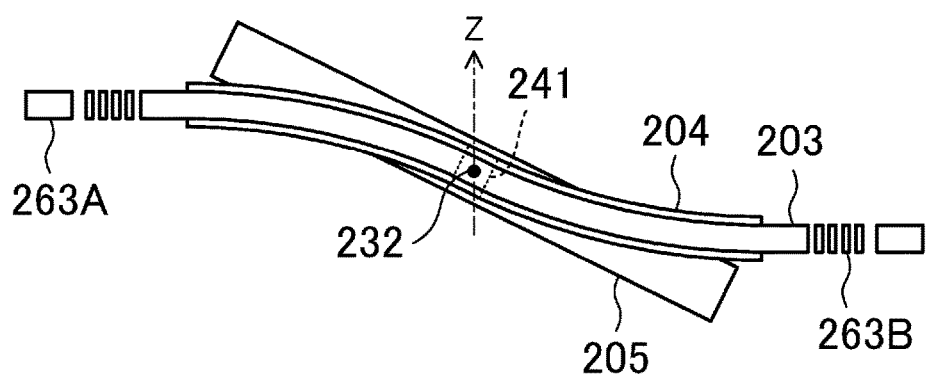

In the mirror device 200 with such a configuration, the first tilting part 203 is coupled to the base 202 and the actuators 206A, 206B via the elastically deformable hinges 232, 263. However, the first tilting part 203 is somewhat constrained by those hinges 232, 263, and therefore, is flexed during tilting. This point will be described with reference to FIGS. 4A, 4B, 5A, and 5B. FIGS. 4A and 4B illustrate how the mirror device operates when viewed in the X-axis direction, wherein FIG. 4A illustrates a state of the mirror device before the mirror tilts, and FIG. 4B illustrates a state of the mirror device while the mirror is tilting. FIGS. 5A and 5B illustrate how the mirror device operates when viewed in the Y-axis direction, wherein FIG. 5A illustrates a state of the mirror device before the mirror tilts, and FIG. 5B illustrates a state of the mirror device while the mirror is tilting. Note that in FIGS. 4A, 4B, 5A, and 5B, the mirror 205 and the first and second tilting parts 203 and 204 are illustrated as having significantly different thicknesses and the deformations of the first and second tilting parts 203 and 204 are exaggerated for convenience sake.

First, it will be described how the first tilting part 203 is flexed while tilting around the principal axis B1. As shown in FIG. 4A, in the initial state, the first tilting part 203, as well as the mirror 205, has a flat shape. As portions of the first tilting part 203 coupled to the hinges 263A, 263B are displaced in this state in the Z-axis direction by the first and second actuators 206A and 206B, the first tilting part 203 tilts around the principal axis B1 and generally on the hinge 232 as a supporting point as shown in FIG. 4B. At this time, a portion of the first tilting part 203 between the hinges 263, 263 (i.e., the first connector 231 in FIG. 4B) and the hinge 232 is flexed, strictly speaking.

Meanwhile, the second tilting part 204 and the mirror 205 are coupled to only a portion of the first tilting part 203 via the first connector 231. If only the portion of the first tilting part 203 coupled to the first connector 231 is taken into account, its flexure is small enough to neglect. Thus, only the tilt of that portion is substantially conducted to the second tilting part 204 and the mirror 205 via the first connector 231. As a result, the mirror 205 and the second tilting part 204 tilt as that portion of the first tilting part 203 coupled to the first connector 231 tilts. In the meantime, the mirror 205 and the second tilting part 204 may be kept from being flexed. In this manner, the degree of planarity of the mirror 205 tilting may be increased.

On the other hand, even if the first tilting part 203 is going to tilt around the second axis B2, the first tilting part 203 also has a flat shape as well as the mirror 205 in the initial state as shown in FIG. 5A. As portions of the first tilting part 203 coupled to the hinges 263A, 263B are displaced in this state in the Z-axis direction by the first and second actuators 206A and 206B, the first tilting part 203 tilts around the second axis B2 and generally on the hinge 232 as a supporting point as shown in FIG. 5B. At this time, the first tilting part 203 is flexed, strictly speaking.

Meanwhile, the mirror 205 is coupled to only a portion of the second tilting part 204 via the second connector 241. If only the portion of the second tilting part 204 coupled to the second connector 241 is taken into account, its flexure is small enough to neglect. Thus, only the tilt of that portion is substantially conducted to the mirror 205 via the second connector 241. As a result, the mirror 205 tilts as that portion of the second tilting part 204 coupled to the second connector 241 tilts. In the meantime, the mirror 205 may be kept from being flexed. In this manner, the degree of planarity of the mirror 205 tilting may be increased.

Figure 6:
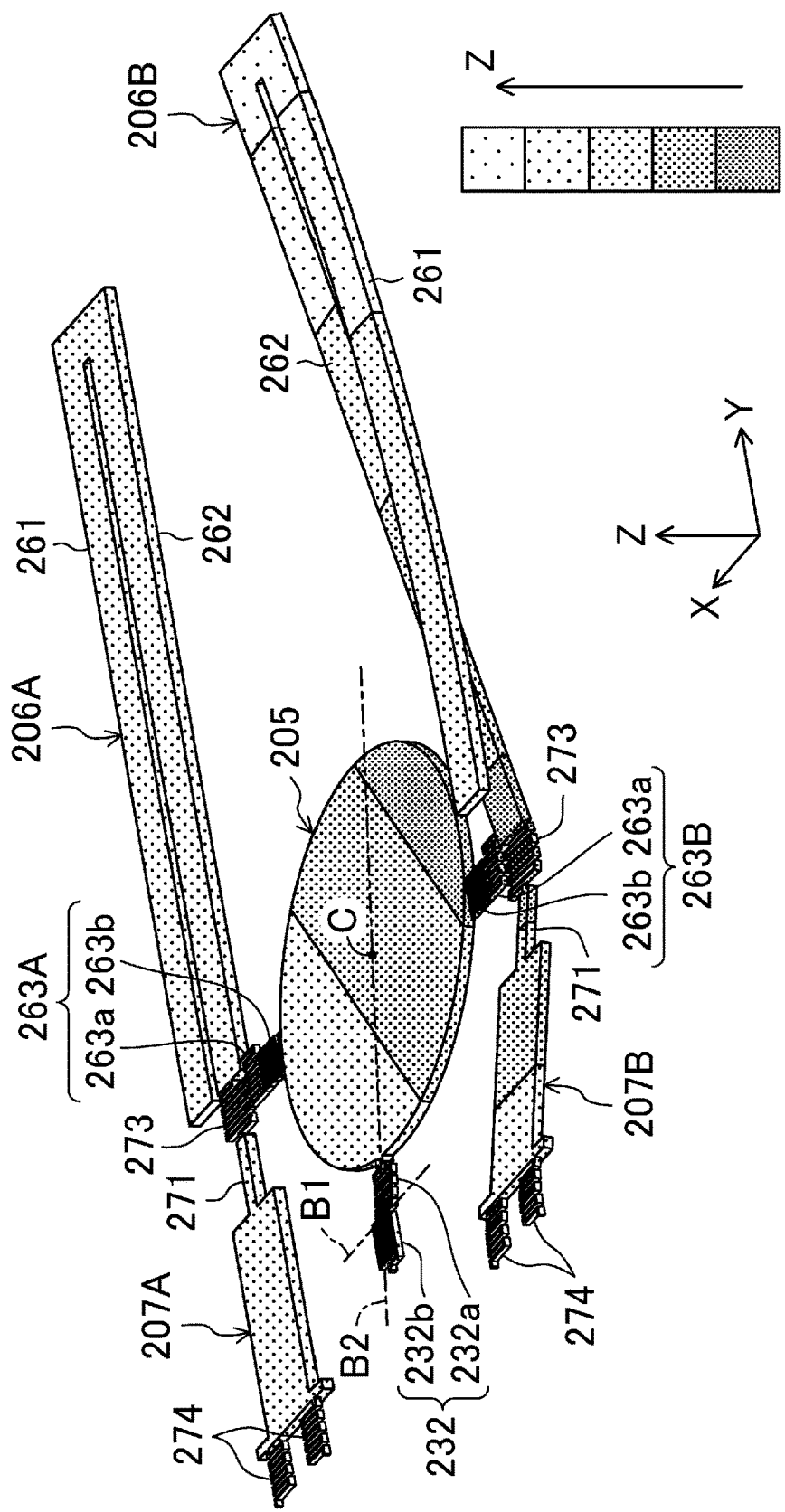
FIG. 6 is a perspective view illustrating how the mirror, first and second actuators, and first and second movable comb electrodes are displaced when only the second actuator is operated.
Figure 7:
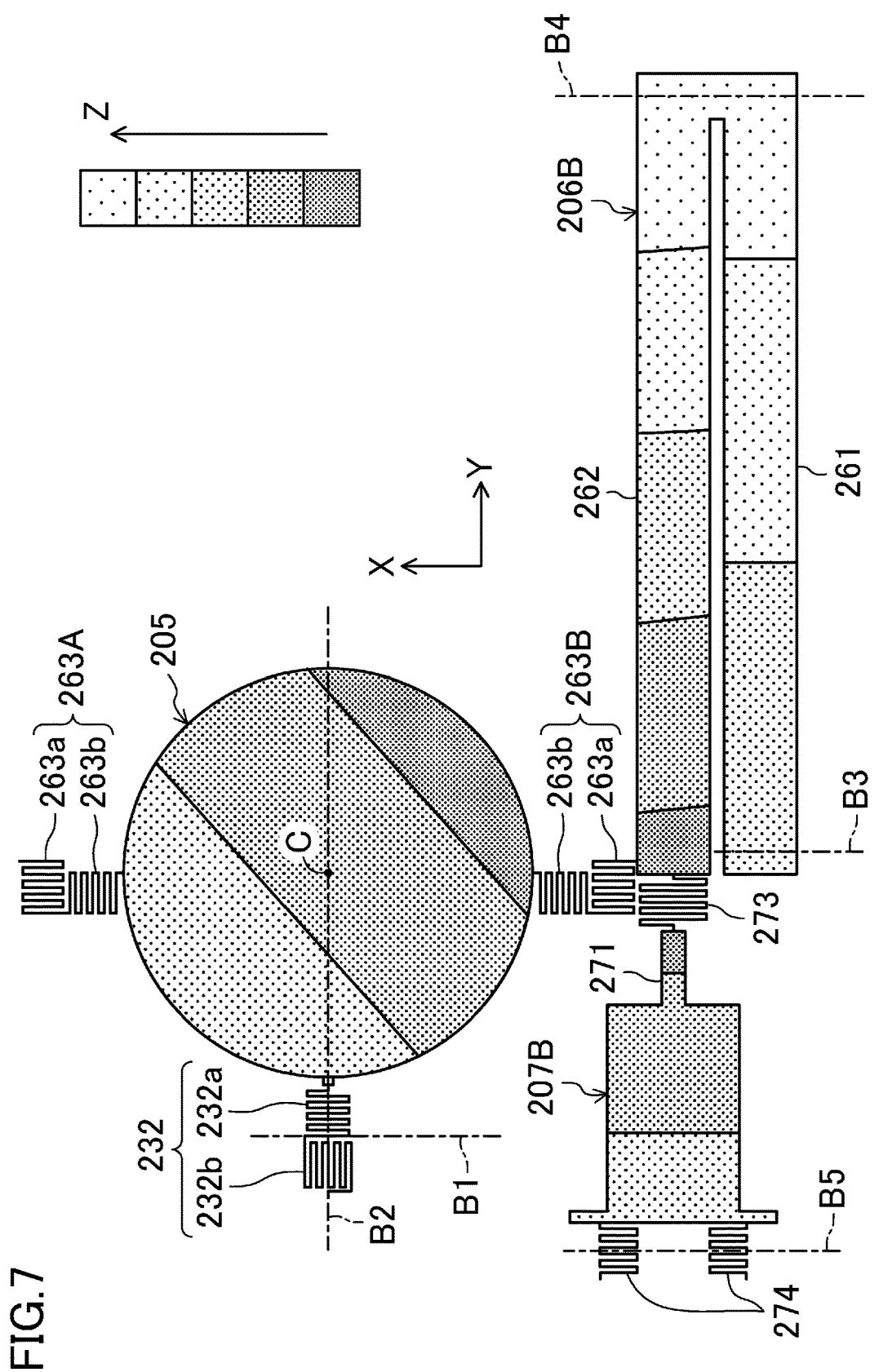
FIG. 7 is a plan view of the mirror, second actuator, and second movable comb electrode in the state shown in FIG. 6.

The mirror device 200 is also configured to detect the displacement of the mirror 205 accurately based on the capacitance between the movable and fixed comb electrodes 207 and 208 by coupling the movable comb electrodes 207 to the actuators 206 and the base 202 via the hinges 273, 274. This point will be described with reference to FIGS. 6 and 7. FIG. 6 is a perspective view illustrating how the mirror 205, the first and second actuators 206A and 206B, and the first and second movable comb electrodes 207A and 207B are displaced when only the second actuator 206B is activated. FIG. 7 is a plan view of the mirror 205, second actuator 206B, and second movable comb electrode 207B in the state shown in FIG. 6. In FIGS. 6 and 7, the first and second tilting parts 203 and 204 and the mirror 205 are illustrated in a simplified form as if these members 203, 204 and 205 formed a single mirror 205. Also, in each of the movable comb electrodes 207, their electrode fingers 272, 272, . . . are illustrated in a simplified form as if they formed a flat plate. Furthermore, in FIGS. 6 and 7, shown are contour lines indicating the levels in the Z-axis direction such that multiple regions at almost the same level in the Z-axis direction are defined by one of the contour lines.

For example, if only the second actuator 206B is tilted as shown in FIG. 6, then the mirror 205 tilts not only around the principal axis B1 but also around the second axis B2 as well. As a result, as indicated by the contour lines in FIGS. 6 and 7, the mirror 205 tilts from the portions coupled to the hinges 232 and 263A toward the opposite sides with respect to the center C.

In this case, the second actuator 206B tilts not only around an axis parallel to the X-axis but also around other axes as well. Particularly, as shown in FIG. 7, in the first straight portion 261, multiple contour lines are arranged in the longitudinal direction thereof, and are substantially parallel to the X-axis. That is to say, the first straight portion 261 tilts around an axis that is substantially parallel to the X-axis. In the second straight portion 262, on the other hand, multiple contour lines are also arranged in the longitudinal direction thereof, and extend generally in the X-axis direction but are not strictly parallel to the X-axis. That is to say, as for the second straight portion 262, the tilt around the axis parallel to the X-axis is certainly dominant, but there are some tilts around other axes, including a tilt around an axis parallel to the Y-axis, as well. This is probably because the mirror 205 tilts not only around the principal axis B1 but also around the second axis B2 as well, as described above. This is also because the tip end of the second straight portion 262 coupled to the hinge 263B is away in the X-axis direction from a portion of the second actuator 206B coupled to the base 202 (i.e., the base end of the first straight portion 261), and a moment around the axis parallel to the Y-axis acts on the tip end of the second straight portion 262 so that the moment is centered around the base end of the first straight portion 261.

Thus, at the tip end of the second straight portion 262, displacement in the Z-axis direction is certainly dominant, but there is a tilt (rotation) around the axis parallel the Y-axis as well.

In addition, an associated one of the movable comb electrodes 207 is coupled, via an associated one of the hinges 273, to the tip end of the second straight portion 262 to be displaced in this manner. Part of the displacement at the tip end of the second straight portion 262 is absorbed due to the deformation of the hinge 273, and the rest of the displacement is conducted to the movable comb electrode 207. Thus, the displacement in the Z-axis direction that is the dominant displacement at the tip end of the second straight portion 262 and its tilt around the axis parallel to the Y-axis are both absorbed into the hinge 273. The displacement in the Z-axis direction is a relatively large one. That is why even if part of the displacement is absorbed into the hinge 273, the displacement is still conducted sufficiently to the movable comb electrode 207. On the other hand, the tilt around the axis parallel to the Y-axis is a slight one, and therefore, is mostly absorbed into the hinge 273 and is hardly conducted to the movable comb electrode 207. As a result, the tip end of the movable comb electrode 207 is displaced substantially only in the Z-axis direction, and therefore, the movable comb electrode 207 tilts substantially only around the tilt axis B5. Particularly, in the movable comb electrode 207, multiple contour lines are arranged as shown in FIG. 7 in the longitudinal direction thereof, and are substantially parallel to the X-axis.

As can be seen, even if any of the actuators 206 tilts around an axis that is not parallel to the X-axis, coupling an associated one of the movable comb electrodes 207 to the actuator 206 via an associated one of the hinges 273 allows the dominant displacement at the tip end of the actuator 206 (i.e., the displacement in the Z-axis direction) to be conducted mostly to the movable comb electrode 207, and substantially prevents displacement toward directions other than the dominant one at the tip end of the actuator 206 from being conducted to the movable comb electrode 207.

As a result, the movable comb electrode 207 may be tilted around the tilt axis B5, i.e., within the YZ plane, as much as possible, thus reducing a variation in the gap between the electrode fingers 272, 272, . . . of the movable comb electrode 207 and the electrode fingers 281, 281, . . . of an associated one of the fixed comb electrodes 208 while the movable comb electrode 207 is tilting. In addition, these two sets of electrode fingers 272, 272, . . . and 281, 281, . . . may also be prevented from coming into contact with each other while the movable comb electrode 207 is tilting. In this manner, the variation in capacitance resulting from the variation in the gap between these two sets of electrode fingers 272, 272, . . . and 281, 281, . . . may be reduced. Thus, the capacitance varies substantially only due to the tilt of the movable comb electrode 207 around the tilt axis B5. As a result, the magnitude of displacement in the Z-axis direction of a portion of the movable comb electrode 207 coupled via the hinge 273 may be obtained accurately based on the variation in the capacitance, and eventually, the magnitude of tilt of the mirror 205 may also be obtained accurately.

As can be seen from the foregoing description, the mirror device 200 includes: a base 200; a mirror 205; an actuator 206 coupled to the mirror 205 and causing the mirror 205 to tilt by tilting itself; a fixed comb electrode 208 provided for the base 202 and having electrode fingers 281, 281, . . . ; and a movable comb electrode 207 arranged to face the fixed comb electrode 208. The movable comb electrode 207 includes: a beam portion 271; a hinge 273 coupling the beam portion 271 to the actuator 206, having lower rigidity than the beam portion 271, and being elastically deformable; a hinge 274 coupling the beam portion 271 to the base 202, having lower rigidity than the beam portion 271, and being elastically deformable; and electrode fingers 272, 272, . . . provided for the beam portion 271 and facing the electrode fingers 281, 281, . . . of the fixed comb electrode 208. The movable comb electrode 207 is configured to tilt around a tilt axis B5 that passes through the hinge 274.

According to this configuration, a tilt of the actuator 206 causes the mirror 205 to tilt. The beam portion 271 of the movable comb electrode 207 is coupled to the actuator 206 via the hinge 273. Thus, as the actuator 206 tilts, the beam portion 271 is displaced accordingly. The beam portion 271 is coupled to the base 202 via the hinges 274, 274, and therefore, tilts around a tilt axis B5 that passes through the hinges 274, 274. Then, portions of the respective electrode fingers 272, 272, . . . and 281, 281, . . . of the movable and fixed comb electrodes 207 and 208 that face each other change their area to cause a variation in capacitance between the movable and fixed comb electrodes 207 and 208. Based on this variation in capacitance, the magnitude of displacement of a portion of the beam portion 271 provided with the hinge 273 may be obtained. The hinge 273 is coupled to the actuator 206. Thus, once the magnitude of displacement of that portion of the beam portion 271 provided with the hinge 273 is known, the magnitude of displacement of the actuator 206 may be obtained. The actuator 206 is coupled to the mirror 205. Thus, once the magnitude of displacement of the actuator 206 is known, the magnitude of displacement of the mirror 205 may also be obtained. In this manner, the magnitude of displacement of the mirror 205 may be obtained based on a variation in capacitance.

In such a configuration, the beam portion 271 of the movable comb electrode 207 is coupled to the actuator 206 via the hinge 273 that is elastically deformable. As the actuator 206 is displaced, the hinge 273 is deformed accordingly. Thus, part of the displacement of the actuator 206 is absorbed into the hinge 273, and the rest of the displacement is conducted to the beam portion 271. For that reason, a slight displacement of the actuator 206 is absorbed into the hinge 273, and the conduction of the displacement to the beam portion 271 is reduced. On the other hand, a dominant displacement of the actuator 206 is conducted to the beam portion 271 mainly. That is to say, the beam portion 271 may be displaced mainly in a direction corresponding to the dominant displacement of the actuator 206, while the magnitude of displacement of the beam portion 271 in the direction corresponding to the slight displacement of the actuator 206 may be reduced. As a result, the movable comb electrode 207 may be tilted with the gap between the respective electrode fingers 272, 272, . . . and 281, 281, . . . of the movable and fixed comb electrodes 207 and 208 maintained. Thus, the capacitance between the movable and fixed comb electrodes 207 and 208 varies substantially only due to the dominant displacement of the actuator 206. Consequently, the displacement of the actuator 206, and eventually, the displacement of the mirror 205, may be detected accurately based on the variation in the capacitance.

In one embodiment, the actuator 206 includes two actuators, the movable comb electrode 207 includes two movable comb electrodes, and the mirror 205 is configured to tilt around two axes through adjustment of the travel distance of the two actuators 206.

According to such an embodiment, the mirror 205 tilts around two axes, and therefore, the actuators 206 may receive reactive force from the mirror 205 to possibly tilt in an unexpected direction other than the expected one in which the actuators 206 are intended to tilt to cause the mirror 205 to be tilted. Even so, coupling the movable comb electrodes 207 to the actuators 206 via the hinges 273 as described above still allows only the displacement corresponding to the intended tilt direction of the actuators 206 to be conducted to the movable comb electrodes 207.

In this particular embodiment, the beam portion 271 is coupled to the base 202 via the hinge 274 so as to tilt more easily around the tilt axis B5 than an axis perpendicular to the tilt axis B5.

According to this embodiment, the beam portion 271 tilts easily around the tilt axis B5 but does not tilt easily around other axes. That is to say, this is a configuration in which not only part of the displacement of the actuator 206 is absorbed into the hinge 273 but also the structure of supporting the beam portion 271 to the base 202 does not tilt easily around axes other than the tilt axis B5. This allows the movable comb electrodes 207 to tilt substantially only around the tilt axis B5 while substantially prohibiting the movable comb electrodes 207 from tilting around axes other than the tilt axis B5. As a result, the variation in capacitance between the movable and fixed comb electrodes 207 and 208 due to the tilt of the movable comb electrodes 207 around the tilt axis B5 may be detected accurately.

In a specific embodiment, the hinge 274 has such a shape that allows the hinge 274 to be flexed more easily around an axis parallel to the tilt axis B5 than around the axis perpendicular to the tilt axis B5. More specifically, the hinge 274 includes a plurality of straight portions extending in the X-axis direction (i.e., along the tilt axis B5) and a folded portion that couples together respective ends of adjacent ones of the straight portions, and has a winding shape as a whole.

A hinge in such a winding shape tends to twist easily around its straight portions and tends to be flexed easily around an axis parallel to the straight portions overall.

In another embodiment, the hinge 274 includes a plurality of hinges 274 which are arranged side by side along the tilt axis B5.

Coupling the beam portion 271 to the base 202 via those hinges 274 arranged side by side along the tilt axis B5 in this manner may reduce tilts of the beam portion 271 around axes other than the tilt axis B5.

In yet another embodiment, the actuator 206 causes the mirror 205 to tilt by tilting itself around axes B3, B4 that are parallel to the tilt axis B5.

According to this embodiment, the axis around which the actuator 206 tilts to cause the mirror 205 to be tilted is parallel to the tilt axis B5 around which the movable comb electrode 207 tilts to detect a variation in capacitance. That is to say, if the movable comb electrode 207 tilts as the actuator 206 tilts in its original direction (i.e., makes its dominant tilt), the movable comb electrode 207 tilts around the tilt axis B5.

In yet another embodiment, the actuator 206 is connected to the mirror 205 via a hinge 263 that is elastically deformable.

According to this embodiment, part of the displacement of the mirror 205 is absorbed into the hinge 263, and therefore, an unwanted tilt of the actuator 206 involved with the displacement of the mirror 205 may be reduced.

Second Embodiment

Figure 8:
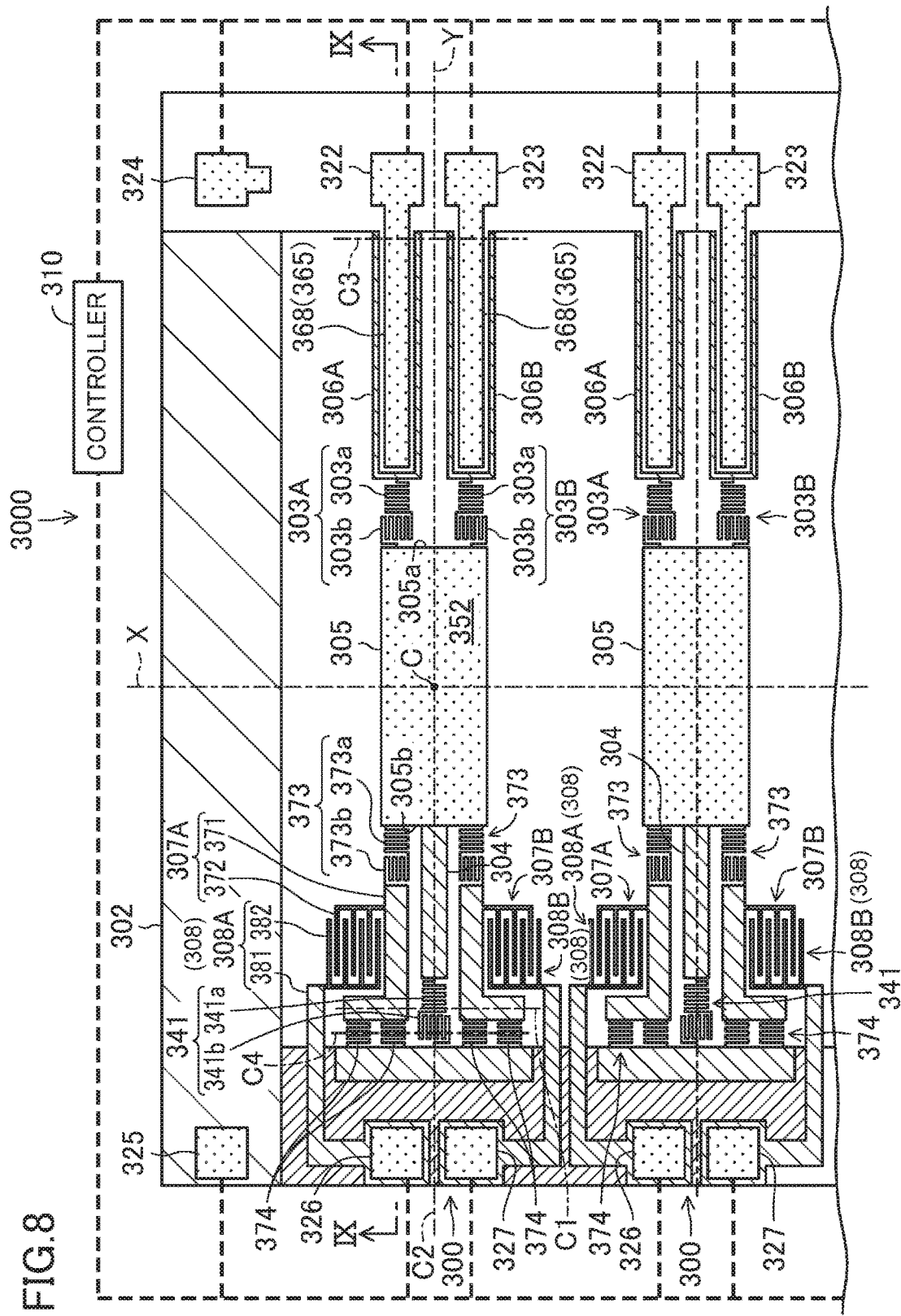
FIG. 8 is a plan view of a mirror array.
Figure 9:
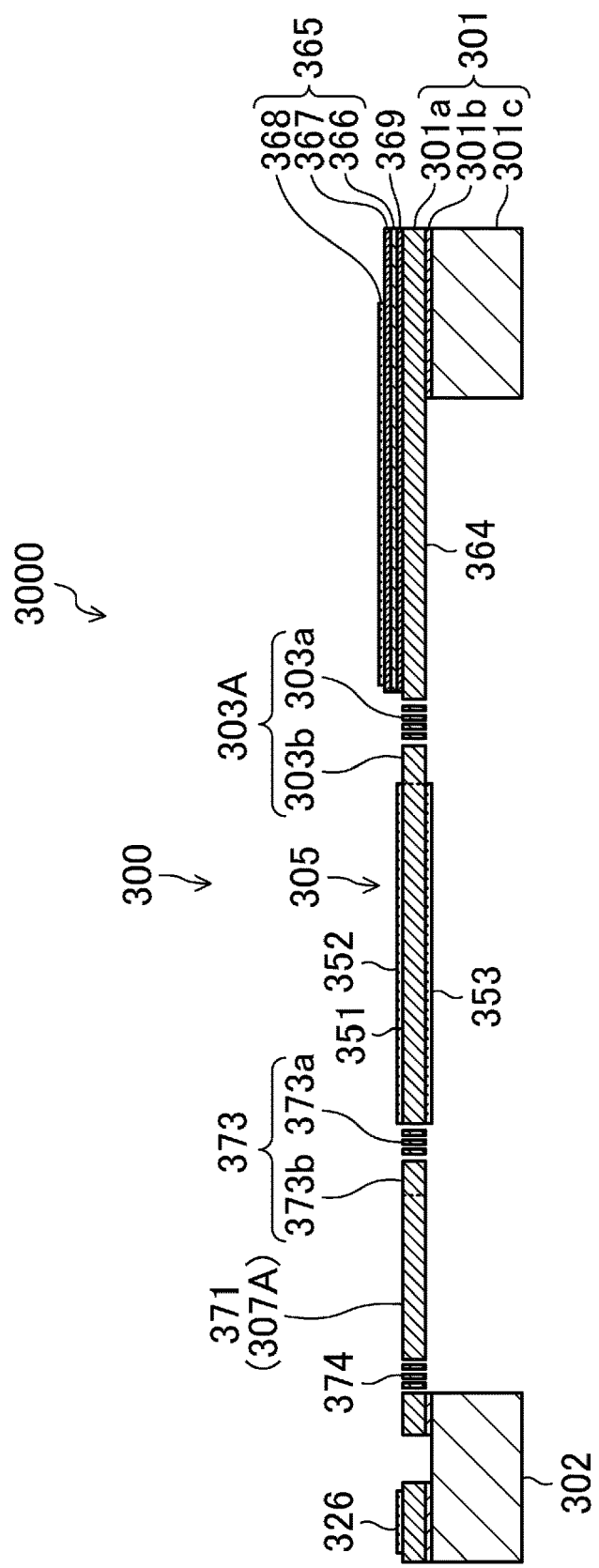
FIG. 9 is a cross-sectional view of the mirror array as taken along the plane IX-IX shown in FIG. 8.

Next, a mirror array 3000 according to a second embodiment will be described. FIG. 8 is a plan view of the mirror array 3000. FIG. 9 is a cross-sectional view of the mirror array 3000 as taken along the plane IX-IX shown in FIG. 8.

In the mirror device 200 of the first embodiment, each movable comb electrode 207 is coupled to an associated actuator 206. In each mirror device 300 according to the second embodiment, however, movable comb electrodes 307 are coupled to a mirror 305, which is a major difference from the first embodiment. While respective elements of the mirror device 200 are identified by reference numerals in 200s, the respective elements of the mirror device 300 are identified by reference numerals in 300s. If the respective reference numerals of an element of the mirror device 200 and an element of the mirror device 300 have the same combination of digits in their tens and ones places, these two elements have basically the same function.

In the mirror array 3000, a plurality of mirror devices 300, 300, . . . are arranged in line. The mirror array 3000 is fabricated on a silicon on insulator (SOI) substrate 301.

Each of the mirror devices 300 includes: a base 302; two actuators 306, 306 coupled to the base 302; a mirror 305 coupled to the two actuators 306, 306; an extension 304 coupling the mirror 305 to the base 302; two movable comb electrodes 307, 307 coupled to the mirror 305; two fixed comb electrodes 308, 308 provided for the base 302 and facing the movable comb electrodes 307, 307; and a controller 310. Note that if these two actuators 306, 306 need to be distinguished from each other, these actuators will be hereinafter referred to as a "first actuator 306A" and a "second actuator 306B," respectively.

The base 302 is formed to have a substantially rectangular frame shape. The base 302 is comprised of a first silicon layer 301a, an oxide layer 301b, and a second silicon layer 301c.

The mirror 305 is formed to have a square shape in a plan view. The mirror 305 includes a mirror body 351 and a mirror-finished layer 352 stacked on the surface of the mirror body 351. The mirror body 351 is formed out of the first silicon layer 301a, while the mirror-finished layer 352 has a multilayer structure comprised of Au and Ti films. Note that another mirror-finished layer 353 similar to the mirror-finished layer 352 is also stacked on the back surface of the mirror body 351. The mirror-finished layer 353 has the function of canceling film stress caused by the mirror-finished layer 352 on the surface of the mirror body 351. As a result, the degree of planarity of the mirror body 351, and eventually, that of the mirror-finished layer 352, may be increased.

In this embodiment, an axis passing through the center C of every mirror 305 and extending along the surface of the mirrors 305 and in the direction in which the mirror devices 300, 300, . . . are arranged is defined to be an X-axis. On the other hand, an axis intersecting at right angles with the X-axis at the center C of each mirror 305 and extending along the surface of the mirror 305 is defined to be a Y-axis. Furthermore, an axis passing through the center C of each mirror 305 and intersecting at right angles with both of the X- and Y-axes is defined to be a Z-axis. That is to say, the X-axis is common for all mirror devices 300, but the Y- and Z-axes are defined on a mirror device 300 basis.

Each of the actuators 306 includes an actuator body 364 and a piezoelectric element 365 stacked on the surface of the actuator body 364.

The actuator body 364 is formed to have a rectangular plate shape in a plan view. The actuator body 364 has one end coupled to the base 302 and extends in the Y-axis direction. The actuator body 364 is formed out of the first silicon layer 301a.

The piezoelectric element 365 is provided on the principal surface of the actuator body 364 (i.e., on the same side as the mirror-finished layer 352 of the mirrors 305). As shown in FIG. 2, an $SiO_2$ layer 369 is stacked on the surface of the actuator body 364, and the piezoelectric element 365 is stacked on the $SiO_2$ layer 369. Just like the actuator body 364, the piezoelectric element 365 is formed to have a rectangular plate shape in a plan view. The piezoelectric element 365 includes a lower electrode 366, an upper electrode 368, and a piezoelectric layer 367 sandwiched between these two electrodes 366, 368. The lower electrode 366, piezoelectric layer 367, and upper electrode 368 are stacked in this order on the $SiO_2$ layer 369. The piezoelectric element 365 is made of different materials from the SOI substrate 301. Specifically, the lower electrode 366 has a multilayer structure comprised of Pt and Ti films. The piezoelectric layer 367 is made of lead zirconate titanate (PZT). The upper electrode 368 has a multilayer structure comprised of Au and Ti films.

The base 302 includes: a first upper terminal 322 electrically connected to the upper electrode 368 of the first actuator 306A; a second upper terminal 323 electrically connected to the upper electrode 368 of the second actuator 306B; and a lower terminal 324 electrically connected to both of the respective lower electrodes 366 of the first and second actuators 306A and 306B. That is to say, a single first upper terminal 322 is provided for each first actuator 306A, and a single second upper terminal 323 is provided for each second actuator 306B. The lower terminal 324 is a common detection terminal provided for all lower electrodes 366.

A voltage is applied to the piezoelectric element 365 of the first actuator 306A via the first upper terminal 322 and the lower terminal 324. A voltage is applied to the piezoelectric element 365 of the second actuator 306B via the second upper terminal 323 and the lower terminal 324. Upon the application of a voltage to the piezoelectric element 365 of each actuator 306, the surface of the actuator body 364 on which the piezoelectric element 365 is stacked shrinks, thus causing the tip end of the actuator body 364 to be displaced in the Z-axis direction.

The tip end of each actuator 306 is coupled to an associated one of the mirrors 305 via an associated hinge 303.

The two actuators 306, 306 are coupled to a shorter side 305a of the mirror 305 that is parallel to the X-axis. Particularly, the first actuator 306A is coupled to one end of the shorter side 305a, and the second actuator 306B is coupled to the other end of the shorter side 305a.

Each of the hinges 303 is formed to be elastically deformable. Particularly, each hinge 303 includes a plurality of straight portions and a folded portion that couples together respective ends of adjacent ones of the straight portions, and has a winding shape as a whole. The hinge 303 includes a first hinge 303a, of which the straight portions extend in the X-axis direction, and a second hinge 303b, of which the straight portions extend in the Y-axis direction. The first hinge 303a is easily flexed around an axis extending in the X-axis direction. On the other hand, the second hinge 303b is easily flexed around an axis extending in the Y-axis direction. The first hinge 303a is coupled to an associated one of the actuators 306. The second hinge 303b is coupled to an associated one of the mirrors 305.

The extension 304 is provided for the other shorter side 305b of each mirror 305 opposite from the shorter side 305a coupled to the hinges 303, 303. The extension 304 extends in the Y-axis direction from substantially the middle of the shorter side 305b. The extension 304 is fixedly coupled to the mirror 305. Specifically, the extension 304, as well as the mirror body 351, is formed out of the first silicon layer 301a.

The extension 304 is coupled to the base 302 via a hinge 341, which has lower rigidity than the extension 304 and is formed to be elastically deformable. Particularly, the hinge 341 includes a plurality of straight portions and a folded portion that couples together respective ends of adjacent ones of the straight portions, and has a winding shape as a whole. The hinge 341 includes a first hinge 341a, of which the straight portions extend in the X-axis direction, and a second hinge 341b, of which the straight portions extend in the Y-axis direction. The first hinge 341a is easily flexed around an axis extending in the X-axis direction. On the other hand, the second hinge 341b is easily flexed around an axis extending in the Y-axis direction. The first hinge 341a is coupled to the extension 304. The second hinge 341b is coupled to the base 302. The hinge 341 is an exemplary extension-side connector.

Two movable comb electrodes 307, 307 are further coupled to the shorter side 305b of each mirror 305. Each of the two movable comb electrodes 307, 307 includes a beam portion 371 extending in the Y-axis direction and three electrode fingers 372, 372, . . . provided for the beam portion 371. The beam portion 371 is provided on the same side of the mirror 305 as the extension 304 with respect to the X-axis, i.e., the opposite side of the mirror 305 from the actuators 306. The beam portion 371 extends in the Y-axis direction along the extension 304. One end of the beam portion 371 is coupled to the mirror 305 via an associated hinge 373. The beam portion 371 of one movable comb electrode 307 is coupled to one end of the shorter side 305b of the mirror 305, while the beam portion 371 of the other movable comb electrode 307 is coupled to the other end of the shorter side 305b of the mirror 305. The other end of the beam portion 371 is bent in an L shape and coupled to the base 302 via two hinges 374, 374. In this manner, the two beam portions 371, 371 and the extension 304 interposed between the two beam portions 371, 371 extend parallel to the Y-axis direction from the shorter side 305b of the mirror 305.

The three electrode fingers 372, 372, . . . are provided on the other side of the beam portion 371 opposite from the extension 304. The three electrode fingers 372, 372, . . .

extend parallel to each other in the Y-axis direction and are formed in the shape of comb teeth. Note that the number of the electrode fingers 372 does not have to be three.

The hinges 373 have the same configuration as the hinges 303. That is to say, the hinges 373 are formed to be elastically deformable. Particularly, the hinges 373 each include a plurality of straight portions and a folded portion that couples together respective ends of adjacent ones of the straight portions, and have a winding shape as a whole. Each of the hinges 373 includes a first hinge 373a, of which the straight portions extend in the X-axis direction, and a second hinge 373b, of which the straight portions extend in the Y-axis direction. The first hinge 373a is easily flexed around an axis extending in the X-axis direction. On the other hand, the second hinge 373b is easily flexed around an axis extending in the Y-axis direction. The first hinge 373a is coupled to an associated one of the mirrors 305. The second hinge 373b is coupled to the beam portion 371. The hinge 373 is an exemplary input-side connector. The first hinge 373a is an exemplary first connector, and the second hinge 373b is an exemplary second connector.

The hinges 374 have the same configuration as the first hinges 373a. That is to say, the hinges 374 are formed to be elastically deformable. Particularly, the hinges 374 each include a plurality of straight portions extending in the X-axis direction and a folded portion that couples together respective ends of adjacent ones of the straight portions, and have a winding shape as a whole. The hinges 374 are easily flexed around an axis extending in the X-axis direction. The two hinges 374, 374 are arranged side by side in the X-axis direction. The beam portion 371 is supported by the base 302 via the hinges 374, 374, and configured to tilt around an axis that passes through the hinges 374, 374 and that is parallel to the X-axis. Such an axis that passes through the hinges 374, 374 and that is parallel to the X-axis will be hereinafter referred to as a "tilt axis C4." The hinge 374 is an exemplary support-side connector.

If the two movable comb electrodes 307, 307 need to be distinguished from each other, the movable comb electrode 307 coupled to one end of the shorter side 305b of their associated mirror 305 so as to face the first actuator 306A will be hereinafter referred to as a "first movable comb electrode 307A," while the movable comb electrode 307 coupled to the other end of the shorter side 305b so as to face the second actuator 306B will be hereinafter referred to as a "second movable comb electrode 307B."

Each of the fixed comb electrodes 308 includes a beam portion 381 extending in the Y-axis direction, and four electrode fingers 382, 382, . . . provided for the beam portion 381. The beam portion 381 extends in the Y-axis direction from an inner peripheral edge of the base 302.

The four electrode fingers 382, 382, . . . extend parallel to each other in the Y-axis direction and are formed in the shape of comb teeth. The seven electrode fingers 372, 372, . . . of an associated one of the movable comb electrodes 307 enter the gaps between the electrode fingers 382, 382, . . . . That is to say, the electrode fingers 372, 372, . . . of each movable comb electrode 307 and the electrode fingers 382, 382, . . . of an associated fixed comb electrode 308 are alternately arranged in the X-axis direction and face each other while keeping out of contact with each other. Note that the number of the electrode fingers 382 does not have to be four.

If the two fixed comb electrodes 308, 308 need to be distinguished from each other, the fixed comb electrode 308 associated with the first movable comb electrode 307A will be hereinafter referred to as a "first fixed comb electrode 308A," while the fixed comb electrode 308 associated with the second movable comb electrode 307B will be hereinafter referred to as a "second fixed comb electrode 308B."

The base 302 includes detection terminals for detecting the capacitance between the movable and fixed comb electrodes 307 and 308. Particularly, the base 302 includes a movable terminal 325 electrically connected to every movable comb electrode 307, first fixed terminals 326 each electrically connected to an associated one of the first fixed comb electrodes 308A, and second fixed terminals 327 each electrically connected to an associated one of the second fixed comb electrodes 308B. That is to say, the movable terminal 325 is provided in common for all movable comb electrodes 307. A single first fixed terminal 326 is provided for each first fixed comb electrode 308A, and a single second fixed terminal 327 is provided for each second fixed comb electrode 308B.

The movable terminal 325 is provided on the surface of a portion of the first silicon layer 301a of the base 302 such that the portion is electrically conductive with all movable comb electrodes 307. Each of the first fixed terminals 326 is provided on the surface of a portion of the first silicon layer 301a of the base 302 such that the portion is electrically conductive with an associated one of the first fixed comb electrodes 308A. Each of the second fixed terminals 327 is provided on the surface of a portion of the first silicon layer 301a of the base 302 such that the portion is electrically conductive with an associated one of the second fixed comb electrodes 308B. Those portions of the first silicon layer 301a provided with the first and second fixed terminals 326 and 327 are electrically insulated from the rest of the first silicon layer 301a.

The mirror array 1 with such a configuration may be fabricated through a manufacturing process including etching the SOI substrate 301 and depositing various films on the surface thereof. For example, an $SiO_2$ layer 369 may be deposited on the surface of the SOI substrate 301. Next, a multilayer structure comprised of Pt and Ti films (to be the lower electrode 366), lead zirconate titanate (to be the piezoelectric layer 367), and a multilayer structure comprised of Au and Ti films (to be the upper electrode 368) are stacked in this order on the $SiO_2$ layer 369. Then, the structure thus obtained is subjected to photolithographic and etching processes, thereby forming a piezoelectric element 365. Subsequently, the first silicon layer 301a is subjected to an anisotropic etching process such ICP-RIE, thereby forming a mirror body 351 and an actuator body 364. Then, a multilayer structure comprised of Au and Ti films is formed on the surface of mirror body 351 to form a mirror-finished layer 352. After that, the piezoelectric element 365 is subjected to a polarization process with a predetermined voltage applied thereto.

—How This Mirror Device Operates—

Next, it will be described how the mirror device 300 with such a configuration operates.

The controller 310 controls the tilt of any selected one of the mirrors 305 by applying a drive voltage to its associated mirror device 300. As the controller 310 applies a drive voltage to an associated one of the first upper terminals 322 and the lower terminal 324, the piezoelectric element 365 of the associated first actuator 306A shrinks in response to the drive voltage. The first actuator 306A has its base end coupled to the base 302, and therefore, tilts around an axis C3 that passes through the base end and that is parallel to the X-axis. In addition, as the controller 310 applies a drive voltage to an associated one of the second upper terminals 323 and the lower terminal 324, the piezoelectric element 365 of the associated second actuator 306B shrinks in response to the drive voltage. Just like the first actuator 306A, the second actuator 306B also has its base end coupled to the base 302, and therefore, tilts around the axis C3 that passes through the base end and that is parallel to the X-axis. The controller 310 outputs the drive voltages to the first and second actuators 306A and 306B independently of each other. That is to say, the controller 310 controls the magnitudes of tilt of the first and second actuators 306A and 306B independently of each other.

As the first actuator 306A tilts, the tip end of the first actuator 306A is displaced accordingly, and a portion of the associated mirror 305 coupled to the associated hinge 303A is displaced in response. Likewise, as the second actuator 306B tilts, the tip end of the second actuator 306B is displaced accordingly, and a portion of the associated mirror 305 coupled to the associated hinge 303B is displaced in response. Since the magnitude of tilt of each actuator 306 is very small, the displacement of the tip end of the actuator 306 may be regarded as a displacement in the Z-axis direction.

The mirror 305 is coupled to the base 302 via the associated extension 304 and hinge 341, and therefore, tilts overall on the hinge 341 as a supporting point. Particularly, the mirror 305 tilts not only around a principal axis C1 that passes through the hinge 341 and that is parallel to the X-axis but also around a second axis C2 that passes through the hinge 341 and the center C of the mirror 305 as well. While the mirror 305 is not operating, the second axis C2 agrees with the Y-axis.

For example, if the magnitude of tilt of the first actuator 306A is the same as that of the second actuator 306B, then the magnitude of displacement in the Z-axis direction of a portion of the shorter side 305$a$ of the mirror 305 coupled to the hinge 303A is the same as that of another portion of the shorter side 305$a$ of the mirror 305 coupled to the hinge 303B. As a result, the mirror 305 tilts around the principal axis C1.

On the other hand, if the magnitude of tilt of the first actuator 306A is different from that of the second actuator 306B, then the magnitude of displacement in the Z-axis direction of a portion of the shorter side 305$a$ of the mirror 305 coupled to the hinge 303A is different from that of another portion of the shorter side 305$a$ of the mirror 305 coupled to the hinge 303B. As a result, the mirror 305 tilts around the second axis C2.

In this manner, the controller 310 adjusts the respective magnitudes of tilt of the first and second actuators 306A and 306B, thereby tilting the mirror 305 in an arbitrary direction by combining the respective tilts of the mirror 305 around the principal and second axes C1 and C2.

While tilting the mirror 305, the controller 310 detects the magnitude of tilt of the mirror 305 based on the capacitance between the movable and fixed comb electrodes 307 and 308.

Particularly, as the mirror 305 tilts with the actuators 306 activated, the movable comb electrodes 307 also tilt accordingly. In this case, one end of the beam portion 371 of each movable comb electrode 307 is coupled to an associated mirror 305 via an associated hinge 373, while the other end of the beam portion 371 is coupled to the base 302 via two associated hinges 374, 374. Thus, as the mirror 305 tilts, a portion of the beam portion 371 coupled to the hinge 373 is displaced along with the displacement of the mirror 305, and tilts as a whole around the tilt axis C4 on the two hinges 374, 374 as supporting points. As a result, respective portions of the electrode fingers 372, 372, . . . of each movable comb electrode 307 and the electrode fingers 382, 382, . . . of an associated fixed comb electrode 308 that face each other change their area, thus causing a variation in the capacitance between the movable and fixed comb electrodes 307 and 308.

Since the first movable comb electrode 307A is coupled to one end of the shorter side 305$b$ of the associated mirror 305 via the associated hinge 373, the displacement in the Z-axis direction of the one end of the shorter side 305$b$ may be detected based on the capacitance between the first movable comb electrode 307A and the first fixed comb electrode 308A. On the other hand, since the second movable comb electrode 307B is coupled to the other end of the shorter side 305$b$ via the associated hinge 373, the displacement in the Z-axis direction of the other end of the shorter side 305$b$ may be detected based on the capacitance between the second movable comb electrode 307B and the second fixed comb electrode 308B.

The controller 310 detects the capacitance between the first movable comb electrode 307A and the first fixed comb electrode 308A via the movable terminal 325 and an associated one of the first fixed terminals 326. The controller 310 also detects the capacitance between the second movable comb electrode 307B and the second fixed comb electrode 308B via the movable terminal 325 and an associated one of the second fixed terminals 327. The controller 310 regulates the respective voltages applied to the first and second actuators 306A and 306B based on the capacitance between the first movable comb electrode 307A and the first fixed comb electrode 308A and the capacitance between the second movable comb electrode 307B and the second fixed comb electrode 308B, respectively, thereby controlling the magnitude of tilt of the mirror 305.

In this case, each mirror 305 tilts around two axes, and therefore, both ends of the shorter side 305$b$ of the mirror 305 tilt not only around the principal axis C1 but also around the second axis C2 as well. On the other hand, in each of the movable comb electrodes 307, one end of the beam portion 371 is coupled to an end of the shorter side 305$b$ of the associated mirror 305 via an elastically deformable hinge 373. Thus, part of the displacement of the mirror 305 is absorbed into the hinge 373 and the rest of the displacement is conducted to the movable comb electrode 307. That is why among the displacements of the ends of the shorter side 305$b$, the more dominant displacement in the Z-axis direction is mostly conducted to the movable comb electrodes 307, and the displacement around the second axis C2 is hardly conducted to the movable comb electrodes 307. As a result, the tilt of the movable comb electrodes 307 around the Y-axis is minimized and the movable comb electrodes 307 tilt such that a portion of their beam portion 371 coupled to the hinge 373 is displaced substantially only in the Z-axis direction.

Thus, the capacitance between the movable and fixed comb electrodes 307 and 308 may be detected accurately. More specifically, the electrode fingers 372, 372, . . . of each movable comb electrode 307 and the electrode fingers 382, 382, . . . of an associated fixed comb electrode 308 are alternately arranged in the X-axis direction and face each other while keeping out of contact with each other. In this state, as the movable comb electrode 307 tilts around the tilt axis C4, i.e., is displaced within the YZ plane, respective portions of the electrode fingers 372, 372, . . . and the electrode fingers 382, 382, . . . that face each other change their area to cause a variation in capacitance between the movable and fixed comb electrodes 307 and 308. However, if the movable comb electrode 307 were displaced toward the direction of the tilt axis C4 or tilted around an axis parallel to the Y-axis, the gap between the electrode fingers 372, 372, . . . and the electrode fingers 382, 382, . . . would change so much as to cause a variation in capacitance for a reason other than the tilt of the movable comb electrode 307 around the tilt axis C4. Furthermore, if the electrode fingers 372, 372, . . . contacted with the electrode fingers 382, 382, . . . , then the capacitance could not be detected anymore. In contrast, if the movable comb electrode 307 is tilted so as to be displaced substantially only in the Z-axis direction, the area of the portions of the electrode fingers 372, 372, . . . and the electrode fingers 382, 382, . . . that face each other may be changed with the size of their gap maintained. As a result, the variation in capacitance caused between the movable and fixed comb electrodes 307 and 308 due to the tilt of the movable comb electrode 307 around the tilt axis C4 may be detected accurately.

Also, the other end of the beam portion 371 of each movable comb electrode 307 is coupled to the base 302 at least at two points arranged along the tilt axis C4. Particularly, the beam portion 371 is coupled to the base 302 via the two hinges 374, 374 which are arranged side by side along the tilt axis C4. Thus, the beam portion 371 tends to tilt more easily around the tilt axis C4 and to tilt less easily around an axis other than the tilt axis C4.

Furthermore, since the straight portions of each hinge 374 extend in the X-axis direction (i.e., along the tilt axis C4), the hinge 374 has such a shape that causes the hinge 374 to be flexed more easily around an axis parallel to the tilt axis C4 than around an axis perpendicular to the tilt axis C4. For this reason as well, the beam portion 371 tends to tilt more easily around the tilt axis C4 and to tilt less easily around an axis other than the tilt axis C4.

In addition, each hinge 373 coupling an associated beam portion 371 to an associated mirror 305 is configured to tilt easily around an axis parallel to the Y-axis as well. Thus, in conducting the displacement of the mirror 305 to the beam portion 371, the hinge 373 may absorb the tilt around the axis parallel to the Y-axis. As a result, even if the mirror 305 tilts around the second axis C2, the movable comb electrode 307 is allowed to tilt substantially only around the tilt axis C4.

Thus, the movable comb electrode 307 may be tilted substantially only around the tilt axis C4, and a variation in capacitance caused between the movable and fixed comb electrodes 307 and 308 due to the tilt of the movable comb electrode 307 around the tilt axis C4 may be detected accurately as well.

In such a configuration in which each movable comb electrode 307 is coupled to an associated mirror 305 via an associated hinge 373, if the displacement of the mirror 305 were absorbed too much into the hinge 373, it would be difficult to detect appropriately the displacement of the mirror 305 based on a variation in capacitance. To cope with this problem, an extension 304 is provided to extend from the mirror 305 toward the base 302 such that one end of the extension 304 closer to the base 302 is coupled to the base 302 via a hinge 341. Thus, the tilt of the mirror 305 may be detected accurately based on a variation in capacitance between the movable and fixed comb electrodes 307 and 308. This point will be described with reference to FIGS. 10A and 10B. FIGS. 10A and 10B illustrate generally how the movable comb electrode 307 is displaced as the mirror 305 tilts, wherein FIG. 10A illustrates a mirror device 300 and FIG. 10B illustrates a partial variation of the mirror device 300 for the purpose of comparison.

In the mirror device 300' shown in FIG. 10B, an extension 304' is coupled fixedly to the base 302, and one end of the extension 304' closer to a mirror 305 is coupled to the mirror 305 via a hinge 341'. In such a configuration, even if the mirror 305 tilts, the extension 304' is not displaced but remains parallel to the surface of the base 302, and therefore, the shorter side 305b is displaced only slightly in the Z-axis direction. As a result, the movable comb electrode 307 tilts only slightly as well. Consequently, even if the mirror 305 tilts, the capacitance between the movable and fixed comb electrodes 307 and 308 does not vary significantly, and it is difficult to detect appropriately the tilt of the mirror 305 based on a variation in capacitance.

In contrast, as shown in FIG. 10A, the extension 304 is coupled fixedly to an associated mirror 305, and one end of the extension 304 closer to the base 302 is coupled to the base 302 via an associated hinge 341. In this configuration, the mirror 305 tilts around a principal axis C1 that passes through the hinge 341. Since the shorter side 305b is more distant from the tilt axis of the mirror 305, the shorter side 305b is displaced more significantly in the Z-axis direction than in the configuration shown in FIG. 10B as the mirror 305 tilts. As a result, as the mirror 305 tilts, the movable comb electrode 307 tilts more significantly. Consequently, as the mirror 305 tilts, the capacitance between the movable and fixed comb electrodes 307 and 308 varies so significantly that the tilt of the mirror 305 may be detected accurately based on the variation in capacitance.

As can be seen, the displacement of the movable comb electrode 307 around the tilt axis C4 may be increased with the displacements of the movable comb electrode 307 around other axes reduced. As a result, the magnitude of variation in capacitance between the movable and fixed comb electrodes 307 and 308 may be increased with the movable comb electrode 307 kept out of contact with the fixed comb electrode 308, and therefore, the tilt of the mirror 305 may be detected accurately.

Furthermore, in a configuration such as this mirror array 3000 in which a plurality of mirror devices 300, 300, . . . are arranged in a predetermined arrangement direction (i.e., in the X-axis direction in this example), the size of each of those mirror devices 300 as measured in the arrangement direction needs to be reduced. In that case, it is recommended that the actuators 306 and movable comb electrodes 307 coupled to each mirror 305 be arranged with respect to the mirror 305 in a direction perpendicular to the arrangement direction (i.e., in the Y-axis direction in this example). In the mirror device 300, the actuators 306 are arranged on one side of the mirror 305 in the direction perpendicular to the arrangement direction, while the movable comb electrodes 307 are arranged on the other side of the mirror 305 in that direction. As a result, the size of the mirror device 300 as measured in the arrangement direction may be reduced, and the space of the mirror 305 in the direction perpendicular to the arrangement direction may be used effectively.

Furthermore, in such a configuration, if the extension 304 is extended from the mirror 305 to the same side as the movable comb electrodes 307 and coupled to the base 302 via the hinge 341, the tilt of the mirror 305 may be detected highly accurately with the movable comb electrodes 307 kept out of contact with the fixed comb electrodes 308 as described above.

As can be seen from the foregoing description, the mirror device 300 includes: a base 302; a mirror 305; an actuator 306 coupled to the mirror 305 and causing the mirror 305 to tilt by tilting itself; a fixed comb electrode 308 provided for the base 302 and having electrode fingers 382, 382, . . . ; and a movable comb electrode 307 arranged to face the fixed comb electrode 308. The movable comb electrode 307 includes: a beam portion 371; a hinge 373 coupling the beam portion 371 to the mirror 305, having lower rigidity than the beam portion 371, and being elastically deformable; a hinge 374 coupling the beam portion 371 to the base 302, having lower rigidity than the beam portion 371, and being elastically deformable; and electrode fingers 372, 372, . . . provided for the beam portion 371 and facing the electrode fingers 382, 382, . . . of the fixed comb electrode 308. The movable comb electrode 307 is configured to tilt around a tilt axis C4 that passes through the hinge 374.

According to this configuration, a tilt of the actuator 306 causes the mirror 305 to tilt. The beam portion 371 of the movable comb electrode 307 is coupled to the mirror 305 via the hinge 373. Thus, as the actuator 306 tilts, the beam portion 371 is displaced accordingly. The beam portion 371 is coupled to the base 302 via the hinges 374, 374, and therefore, tilts around a tilt axis C4 that passes through the hinges 374, 374. Then, portions of the respective electrode fingers 372, 372, . . . and 382, 382, . . . of the movable and fixed comb electrodes 307 and 308 that face each other change their area to cause a variation in capacitance between the movable and fixed comb electrodes 307 and 308. Based on this variation in capacitance, the magnitude of displacement of a portion of the beam portion 371 provided with the hinge 373 may be obtained. The hinge 373 is coupled to the mirror 305. Thus, once the magnitude of displacement of that portion of the beam portion 371 provided with the hinge 373 is known, the magnitude of displacement of the mirror 305 may be obtained. In this manner, the magnitude of displacement of the mirror 305 may be obtained based on a variation in capacitance.

In such a configuration, the beam portion 371 of the movable comb electrode 307 is coupled to the mirror 305 via the hinge 373 that is elastically deformable. As the mirror 305 is displaced, the hinge 373 is deformed accordingly. Thus, part of the displacement of the mirror 305 is absorbed into the hinge 373 and the rest is conducted to the beam portion 371. For that reason, a slight displacement of the mirror 305 is absorbed into the hinge 373, and the conduction of the displacement to the beam portion 371 is reduced. On the other hand, a dominant displacement of the mirror 305 is conducted to the beam portion 371 mainly. That is to say, the beam portion 371 may be displaced mainly in a direction corresponding to the dominant displacement of the mirror 305, while the magnitude of displacement of the beam portion 371 in the direction corresponding to the slight displacement of the mirror 305 may be reduced. As a result, the movable comb electrode 307 may be tilted with the gap between the respective electrode fingers 372, 372, . . . and 382, 382, . . . of the movable and fixed comb electrodes 307 and 308 maintained. Thus, the capacitance between the movable and fixed comb electrodes 307 and 308 varies substantially only due to the dominant displacement of the mirror 305. Consequently, the displacement of the mirror 305 may be detected accurately based on the variation in the capacitance.

Other Embodiments

Embodiments have just been described as examples of the technique disclosed in the present application. However, the present disclosure is not limited to those exemplary embodiments, but is also applicable to other embodiments which are altered or substituted, to which other features are added, or from which some features are omitted, as needed. Optionally, the components described in those embodiments may be combined to create a new embodiment. The components illustrated on the accompanying drawings and described in the detailed description include not only essential components that need to be used to overcome the problem, but also other unessential components that do not have to be used to overcome the problem but that are illustrated or mentioned there just for the sake of showing a typical example of the technique. Therefore, such unessential components should not be taken for essential ones, simply because such unessential components are illustrated in the drawings or mentioned in the detailed description.

The embodiments described above may be modified in the following manner.

The first embodiment described above is directed to a mirror device and the second embodiment described above is directed to a mirror array. However, these are only non-limiting exemplary embodiments. For example, a mirror array may also be comprised of a plurality of mirror devices 200, 200, . . . . Alternatively, a single mirror device 300 may be used by itself.

Also, the shapes, sizes, and materials adopted in the embodiments described above are only examples and in no way limiting, either. For example, the mirror 205 does not have to have a circular shape in a plan view, but may also have a square or any other polygonal shape. Likewise, the mirror 305 does not have to have a square shape in a plan view, but may also have a circular or any other polygonal shape.

Furthermore, the configurations of the respective hinges are not limited to the ones adopted in the embodiments described above, either. For example, each of those hinges may also have an arbitrary configuration as long as the hinge has lower rigidity than a member coupled thereto and is elastically deformable.

The actuators 206, 306 do not have to have the configurations described above, either. Also, the actuators 206, 306 each have a piezoelectric element 265, 365, but it is only an exemplary embodiment. For example, those actuators may also be each implemented as an actuator driving a mirror with electrostatic attraction. Furthermore, the piezoelectric elements 265, 365 may use, in their piezoelectric layer, KNN ((K, Na)NbO$_3$) that is a non-lead piezoelectric material instead of PZT. Moreover, the mirror device 300 may include only one actuator as well.

Besides, as long as the first and second tilting parts 203 and 204 are configured to be coupled to the base 202 and tilted by the actuators 206, the first and second tilting parts 203 and 204 may also have any arbitrary configuration.

For example, the first and second tilting parts 203 and 204 do not have to have a ring shape. The first and second tilting parts 203 and 204 do not have to have a circular shape or an arc shape. The first connectors 231, 231 do not have to be arranged on the X-axis, and the second connectors 241, 241 do not have to be arranged on the Y-axis. The line passing through the first connectors 231, 231 does not have to intersect at right angles with the line passing through the second connectors 241, 241, and does not have to be parallel to the X-axis, either. The line passing through the second connectors 241, 241 does not have to be parallel to the Y-axis. For example, the second connectors 241, 241 may be arranged on the X-axis, and the first connectors 231, 231 may be arranged on the Y-axis.

The configurations of the movable comb electrodes 207, 307 and fixed comb electrodes 208, 308 described above are just exemplary ones, and any other configurations may be adopted for them as well. The locations of the movable comb electrodes 207, 307 and fixed comb electrodes 208, 308 and the directions in which their electrode fingers extend may be defined arbitrarily. For example, the electrode fingers of the movable comb electrodes and the electrode fingers of the fixed comb electrodes do not have to extend in the Y-axis direction but may extend in the X-axis direction.

Figure 11:
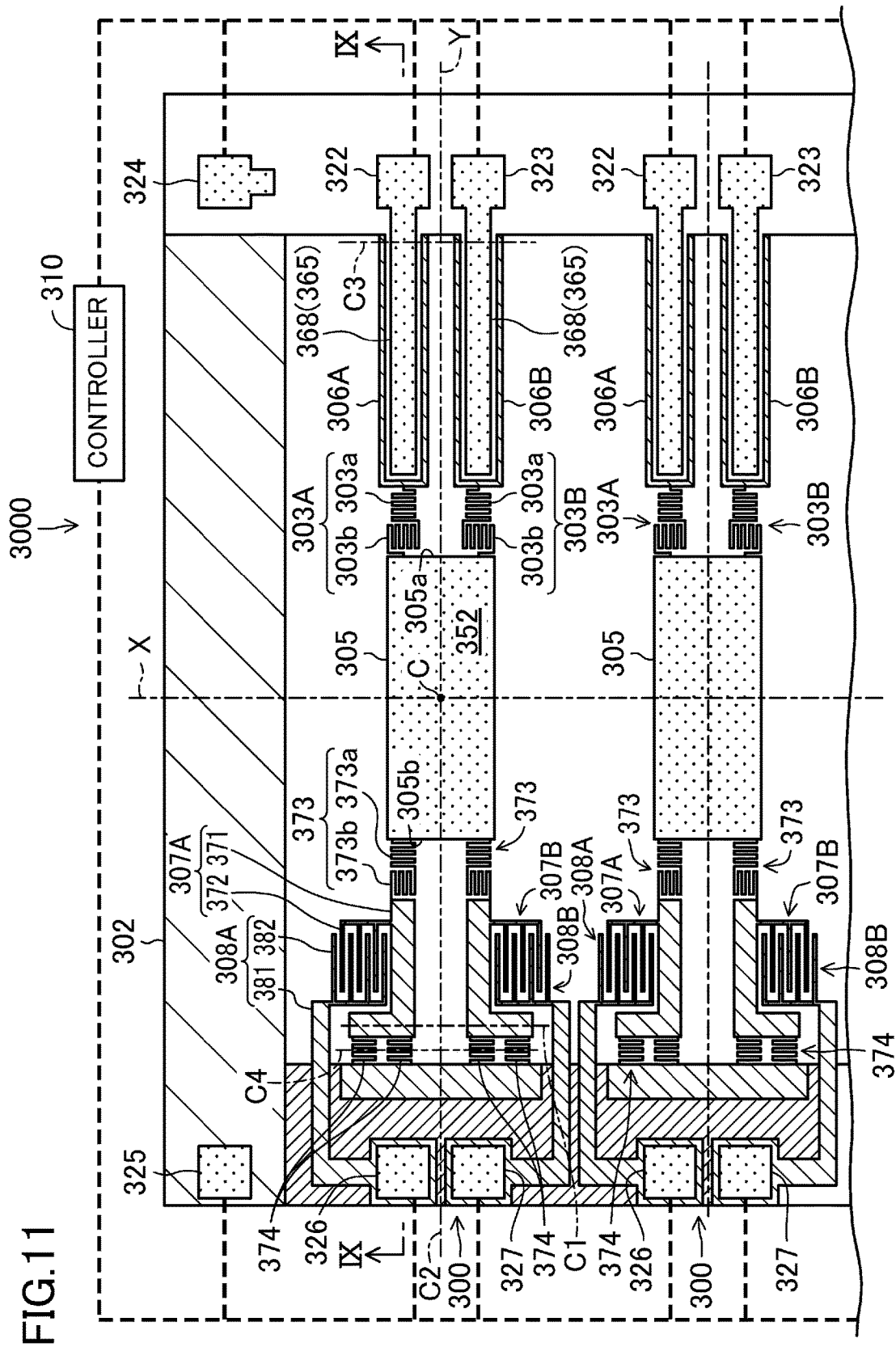
FIG. 11 is a plan view of a mirror array according to another embodiment.

Furthermore, in each of the mirror devices 300, the mirror 305 is coupled to the base 302 via the extension 304. However, this is only an exemplary embodiment. For example, as shown in FIG. 11, the extension 304 and the hinge 341 may be omitted. In that case, the mirror 305 is coupled to the base 302 via the movable comb electrodes 307. If the mirror 305 is coupled to the base 302 via the movable comb electrodes 307 with the extension 304 and hinge 341 omitted, the size of the mirror device 300 as measured in the arrangement direction thereof may be reduced.

The mirror devices 200, 300 are exemplary drive apparatuses. However, the drive apparatus does not have to be a one that drives a mirror. For example, the drive apparatus may also be a shutter device configured to drive a blade or plate as a moving part with an actuator.

INDUSTRIAL APPLICABILITY

As can be seen from the foregoing description, the present disclosure is useful for a drive apparatus.

DESCRIPTION OF REFERENCE CHARACTERS

200, 300 Mirror Device (Drive Apparatus)
202, 302 Base
205, 305 Mirror (Moving Part)
206, 306 Actuator
263 Hinge (Moving-Part-Side Connector)
207, 307 Movable Comb Electrode
271, 371 Beam Portion
272, 372 Electrode Finger
273, 373 Hinge (Input-Side Connector)
274, 374 Hinge (Support-Side Connector)
208, 308 Fixed Comb Electrode
281, 382 Electrode Finger
B5, c4 Tilt Axis

The invention claimed is:
1. A drive apparatus comprising:
a base;
a moving part;
an actuator including a first piezoelectric actuator and a second piezoelectric actuator each comprising an actuator body extending from the base and a piezoelectric element stacked on a surface of the actuator body, and coupled to the moving part and configured to cause the moving part to tilt by tilting itself;
a fixed comb electrode provided for the base and having electrode fingers; and
a movable comb electrode arranged to face the fixed comb electrode; and
a controller configured to detect a magnitude of tilt of the moving part, tilted by the actuator, based on a capacitance between the fixed comb electrode and the movable comb electrode, and to control a moving distance of the moving part by the actuator, wherein
the movable comb electrode includes:
a beam portion;
an input-side connector configured to couple the beam portion to either the moving part or the actuator, having lower rigidity than the beam portion, and being elastically deformable;
a support-side connector configured to couple the beam portion to the base, having lower rigidity than the beam portion, and being elastically deformable; and
electrode fingers provided for the beam portion and facing the electrode fingers of the fixed comb electrode, and
the movable comb electrode is configured to tilt around a tilt axis that passes through the support-side connector,
the base is not displaced when the moving part tilts,
one of or both of the first and second piezoelectric actuators drive to cause the moving part to tilt around (i) the tilt axis or an axis parallel to the tilt axis and (ii) an axis intersecting with the tilt axis,
the first and/or second piezoelectric actuators cause a portion, of the beam portion, connected to the input-side connector to displace in a direction intersecting with a surface of the beam portion, and
in an either case where the moving part tilts around (i) the tilt axis or the axis parallel to the tilt axis or (ii) the axis intersecting with the tilt axis, the controller detects the magnitude of tilt of the moving part, and to control the moving distance of the moving part by the actuator.

2. The drive apparatus of claim 1, wherein
the movable comb electrode includes at least two movable comb electrodes, and
the moving part is configured to tilt around (i) the tilt axis or the axis parallel to the tilt axis and (ii) the axis intersecting with the tilt axis through adjustment of the travel distance of the at least two actuators.

3. The drive apparatus of claim 2, wherein
the beam portion is coupled to the base via the support-side connector so as to tilt more easily around the tilt axis than around an axis perpendicular to the tilt axis.

4. The drive apparatus of claim 3, wherein
the support-side connector has such a shape that allows the support-side connector to be flexed more easily around an axis parallel to the tilt axis than around the axis perpendicular to the tilt axis.

5. The drive apparatus of claim 3, wherein
the support-side connector includes a plurality of support-side connectors which are arranged side by side along the tilt axis.

6. The drive apparatus of claim 1, wherein
the actuator causes the moving part to tilt by tilting itself around the axis that is parallel to the tilt axis, and
the movable comb electrode is coupled to the actuator via the input-side connector.

7. The drive apparatus of claim 6, wherein
the actuator is connected to the moving part via a moving-part-side connector that is elastically deformable.

8. The drive apparatus of claim 2, wherein
the actuator causes the moving part to tilt by tilting itself around the axis that is parallel to the tilt axis, and
the movable comb electrode is coupled to the actuator via the input-side connector.

9. The drive apparatus of claim 3, wherein
the actuator causes the moving part to tilt by tilting itself around the axis that is parallel to the tilt axis, and
the movable comb electrode is coupled to the actuator via the input-side connector.

10. The drive apparatus of claim 4, wherein
the actuator causes the moving part to tilt by tilting itself around the axis that is parallel to the tilt axis, and
the movable comb electrode is coupled to the actuator via the input-side connector.

11. The drive apparatus of claim 5, wherein
the actuator causes the moving part to tilt by tilting itself around the axis that is parallel to the tilt axis, and
the movable comb electrode is coupled to the actuator via the input-side connector.

12. The drive apparatus of claim 1, wherein
the fixed comb electrode comprises two fixed comb electrodes each corresponding to one of the first and second piezoelectric actuators,
the movable comb electrode comprises two movable comb electrodes each arranged to face a corresponding one of the two fixed comb electrodes,
between the first and second piezoelectric actuators, the moving part is connected to the base via a hinge extending in the same direction as the beam portion extends; and
the hinge allows the moving part to tilt around the tilt axis and the axis intersecting with the tilt axis.

* * * * *